(12) United States Patent
Urano et al.

(10) Patent No.: US 8,070,316 B2
(45) Date of Patent: Dec. 6, 2011

(54) LIGHTING APPARATUS WITH LEDS

(75) Inventors: Youji Urano, Ikeda (JP); Takuya Nakatani, Hirakata (JP); Yasuhiro Hidaka, Hirakata (JP); Yoshiro Goto, Katano (JP)

(73) Assignee: Panasonic Electric Works Co., Ltd., Kadoma-shi (JP)

( * ) Notice: Subject to any disclaimer, the term of this patent is extended or adjusted under 35 U.S.C. 154(b) by 154 days.

(21) Appl. No.: 12/086,389

(22) PCT Filed: Dec. 21, 2006

(86) PCT No.: PCT/JP2006/325527
§ 371 (c)(1),
(2), (4) Date: Jun. 12, 2008

(87) PCT Pub. No.: WO2007/072919
PCT Pub. Date: Jun. 28, 2007

(65) Prior Publication Data
US 2009/0046456 A1    Feb. 19, 2009

(30) Foreign Application Priority Data
Dec. 22, 2005    (JP) .................................. 2005-371116

(51) Int. Cl.
F21S 4/00    (2006.01)
F21V 21/00   (2006.01)
F21V 1/00    (2006.01)
F21V 11/00   (2006.01)
F21V 5/00    (2006.01)
(52) U.S. Cl. .................... 362/249.02; 362/235; 362/244
(58) Field of Classification Search ............. 362/249.02, 362/235, 244
See application file for complete search history.

(56) References Cited

U.S. PATENT DOCUMENTS 6,042,251 A  * 3/2000 McCarthy et al. ............ 362/308
6,502,975 B1 * 1/2003 Branstetter .................... 362/549
6,578,994 B1 * 6/2003 Beyerlein ...................... 362/490

(Continued)

FOREIGN PATENT DOCUMENTS

CN    2526659    12/2002

(Continued)

OTHER PUBLICATIONS

International Search Report mailed Mar. 20, 2007, issued on PCT/JP2006/325527.

(Continued)

Primary Examiner — David Crowe
(74) Attorney, Agent, or Firm — Edwards Wildman Palmer LLP

(57) ABSTRACT

A lighting apparatus with LED includes a metal-made main body 90; a plurality of LED chip units 1 each including an LED chip and a pair of lead terminals 42, 43 electrically connected to electrodes of the LED chip; and a dielectric layer 80 disposed between the main body 90 and each LED chip unit 1 for making electrical insulation therebetween as well as bond the same. The circuit board 20 is formed with a plurality of windows 23 through which the individual LED chip units 1 extend respectively with the lead terminals held in electrical contact with the circuit pattern of the circuit board at the circumference of the window, each of the LED chip units being thermally coupled at its bottom face with the main body 90 through the dielectric layer 80, and the heat generated in the LED chip is conducted to the main body through the dielectric layer without passing through the circuit board.

12 Claims, 30 Drawing Sheets

U.S. PATENT DOCUMENTS

| | | | |
|---|---|---|---|
| 6,648,498 B1 * | 11/2003 | Tsao | 362/235 |
| 7,441,925 B2 * | 10/2008 | Chou et al. | 362/294 |
| 2004/0052077 A1 * | 3/2004 | Shih | 362/294 |
| 2004/0065894 A1 | 4/2004 | Hashimoto et al. | |
| 2004/0075100 A1 | 4/2004 | Bogner et al. | |
| 2004/0129946 A1 * | 7/2004 | Nagai et al. | 257/98 |
| 2004/0264195 A1 * | 12/2004 | Chang et al. | 362/294 |
| 2005/0023538 A1 * | 2/2005 | Ishii et al. | 257/79 |
| 2005/0077616 A1 | 4/2005 | Ng et al. | |
| 2006/0138645 A1 | 6/2006 | Ng et al. | |
| 2006/0291206 A1 * | 12/2006 | Angelini et al. | 362/244 |

FOREIGN PATENT DOCUMENTS

| | | |
|---|---|---|
| CN | 1466782 A | 1/2004 |
| CN | 1602555 | 3/2005 |
| JP | 11307875 A * | 11/1999 |
| JP | 2001-203396 | 7/2001 |
| JP | 2003-059332 | 2/2003 |
| JP | 2003-152225 | 5/2003 |
| JP | 2003-168829 | 6/2003 |
| JP | 2005-100810 | 4/2005 |
| JP | 2005-117041 | 4/2005 |
| JP | 2005136224 A * | 5/2005 |
| KR | 10-2004-0025358 A | 3/2004 |
| KR | 10-2005-0035638 A | 4/2005 |
| WO | WO-03/019679 A1 | 3/2003 |

OTHER PUBLICATIONS

Chinese Examination Report dated Aug. 7, 2009 issued on Chinese patent application No. 200680048537.9 and the English translation thereof.

Examination Report issued in corresponding Korean Application on Apr. 27, 2010.

Chinese Office Action for Chinese Patent Application 201010105402.X issued Mar. 30, 2011.

* cited by examiner (a)

(b)

LIGHTING APPARATUS WITH LEDS

BACKGROUND OF THE INVENTION

1. Field of the Invention

The present invention relates to a lighting apparatus with LEDs (light emitting diodes).

2. Description of the Related Art

The research of light emitting device has been widely carried out and developed so far by utilizing an LED chip and a phosphor (fluorescent pigment, fluorescent dye, or the like) acting as wavelength conversion material which is excited by a light from the LED chip to emit a light of a color different from a luminescent color of the LED chip. The light emitting device enables to emit a light of a color different from the luminescent color of the LED chip by combining the LED chip with the phosphor, leading to commercialization of a white light emitting device (generally referred to as white LED) and the like. The white light emitting device emits a white light (light emission spectrum of white light) by a combination of the phosphor with the LED chip emitting a blue color light, an ultraviolet light, or the like.

As the output of the LED chip is increased recently, the white LED has been actively studied and developed for utilized as a lighting apparatus. Japanese Patent Publication No. 2003-59332 proposes an LED unit (an LED module) comprising a circuit board mounting a plurality of white LEDs.

Japanese Patent Publications No. 2003-168829 and 2001-203396 propose structures configured to efficiently exhaust a heat, accompanied with the high light output, which is generated from each of the light emitting parts of LED chips. In the conventional LED units, however, the respective LED chips are electrically connected with conductive patterns on a circuit board directly, so that the heat generated from the LED chips spreads over the circuit board through electrical connection parts. Thus, a metal-made heat radiative board is necessarily attached to the bottom surface of the circuit board for enhancing thermally conductive performance over a whole range of the circuit board, thereby increasing a cost of the circuit board. Furthermore, when comprising such LED unit, the lighting apparatus requires a dielectric sheet to be interposed between a metal-made main body and a metal plate of the circuit board so as to protect the LED unit from a lightning surge as well as enhancing thermally conductive performance by thermally coupling the metal plate of the circuit board to the metal-made main body including one part of the lighting apparatus. In this case, however, the thermally conductive performance cannot be sufficiently made due to two dielectric layers, dielectric layer of the circuit board and the dielectric sheet, interposed on thermally conductive path from the LED chip to the metal-made main body through the circuit board.

SUMMARY OF THE INVENTION

In view of the above problem, the present invention has been achieved to provide a lighting apparatus with light emitting diodes (LEDs) which is capable of suppressing temperature rise in the LED chip to realize a high light output and reduce a cost of circuit board. The lighting apparatus according to the present invention includes a metal-made main body 90; a plurality of LED chip units 1 each including an LED chip and a pair of lead terminals 42, 43 electrically connected to electrodes of the LED chip; and a dielectric layer 80 disposed between the main body 90 and the LED chip units 1 for providing electrical insulation as well as providing thermally conductive coupling therebetween. The circuit board 20 is formed with a plurality of windows 23 through which the individual LED chip units 1 extend respectively with the lead terminals held in electrical contact with a circuit pattern 22, each of the LED chip units being thermally coupled at its bottom face with the main body 90 through the dielectric layer 80. With this arrangement, the dielectric layer 80 can transfer a heat from the LED chip to the main body not through the circuit board, enabling to reduce a thermal resistance between a light emitting part of the LED chip and the main body for enhancing the thermally conductive performance and suppressing a rise in the junction temperature of the LED chip. Therefore, an input electric power can be increased for achieving the high light output, compared to a prior art. Furthermore, it also enables adoption of a less expensive circuit board, such as glass epoxy board, as the circuit board than a metal board, without any consideration of its ability to radiate the heat, thereby reducing the cost of the circuit board.

Preferably, each of the LED chip units has its bottom face defined by the lead terminals 42, 43 which are mounted on the dielectric layer 80, so that the heat generated in the LED is efficiently conducted to the main body through the dielectric layer from the lead terminals.

The lighting apparatus is preferably formed with a light-transmissive member 91, 200 to pass a visible light from each of the LED chip units 1, and a mirror 24 is formed on a top face of the circuit board 20 opposed to the light-transmissive member for reflecting the visible light. With this arrangement, the mirror can reflect the visible light suffering from a total reflection by the light-transmissive member after radiated from each of the LED chip units 1, enabling to enhance the light output.

The circuit board 20 is preferably formed on its top face with the circuit pattern 22 as well as the mirror 24.

The circuit pattern 22 may be formed on a bottom face of the circuit board 20. In this case, the circuit pattern and the mirror can be made of appropriate materials and formed by suitable patterns, increasing the degree of pattern design and a surface area of the mirror to further enhance the light output.

Aluminum is preferably used for the mirror to enhance a reflectivity of light having a wavelength in visible region.

Preferably, the main body is shaped into a disk having its one face with a dent 192 for receiving therein each of the LED chip units 1 and the circuit board, and a wire insertion hole 194 formed in a bottom of the dent to extend through a center of the main body for passing power feeding cables connected to the circuit board at its center. This arrangement does not necessitate a space for drawing the cables within the dent 192 of the main body, thinning the main body.

In a preferred embodiment of the present invention, the main body is provided with attaching screw holes 195 at a periphery of the dent 192 of the main body for passing a plurality of attaching screws therethrough from its surface so as to fix the main body 90 to a supporting material. Preferably, a metallic frame-shaped decorative cover 210 is provided with a window 211 exposing a light output surface of the light-transmissive member, and attached to the main body for concealing the periphery of the dent 192 and each of the attaching screws on the surface of the main body. With this configuration, the main body can be easily attached to the supporting material such as a ceiling material by means of the attaching screws hidden behind the decorative cover to improve its authentic appearance. Moreover, the metallic decorative cover enables to radiate the heat and further suppress the rise in junction temperature of the LED chip.

It is preferable that the light-transmissive member is formed with lenses 205 at its portions opposing the respective LED chip units for controlling orientation of the light from the LED chip units, and rest of the portions is made of metal. This arrangement enables to control the orientation of light from each LED chip units. As being made of metal in the portion other than the lenses, the present light-transmissive member can enhance the thermally conductive performance, compared to other light-transmissive materials entirely made of synthetic resin, glass, or the like, whereby enabling to further suppress the rise in the junction temperature of the LED chip.

Furthermore, each of the LED chip units preferably includes a thermally conductive plate 121 made of a thermally conductive material for mounting thereto the LED chip, a sub-mount member 30 interposed between the LED chip and the thermally conductive plate for alleviating a stress acting on the LED chip due to a difference in linear coefficient of thermal expansion therebetween, and a dielectric board 122 mounted on the thermally conductive plate. In this case, a pair of terminal patterns is arranged on a surface of the dielectric board 122 to make an electrical connection with the respective electrodes of the LED chip, forming the lead terminals. The dielectric board is formed with a hole receiving the sub-mount member for contacting a bottom face of the sub-mount member with the thermally conductive plate. In this case, the thermally conductive plate defines the bottom face of the LED chip unit, so that the heat generated in the LED chip can be efficiently conducted to the main body through the sub-mount member 30 and the thermally conductive plate 121 not through the circuit board 20. The sub-mount member can alleviate the stress acting on the LED chip due to the difference in linear coefficient of thermal expansion between the LED chip and the thermally conductive plate. The terminal patterns 123 forming the lead terminals of the LED chip are formed on the dielectric board 122, enabling to lengthen an insulation distance between the main body 90 and the lead terminals 123a, 123b and improve its reliability.

Preferably, the terminal pattern 123 in the LED chip unit 1 is partially exposed on the surface of the dielectric board 122 to define an outer lead 123b, where the circuit pattern 22 of the circuit board 20 is electrically connected to the outer lead 123 at a circumference of the window 23.

DETAILED DESCRIPTION OF EXEMPLARY EMBODIMENTS

First Embodiment

Figure 1:
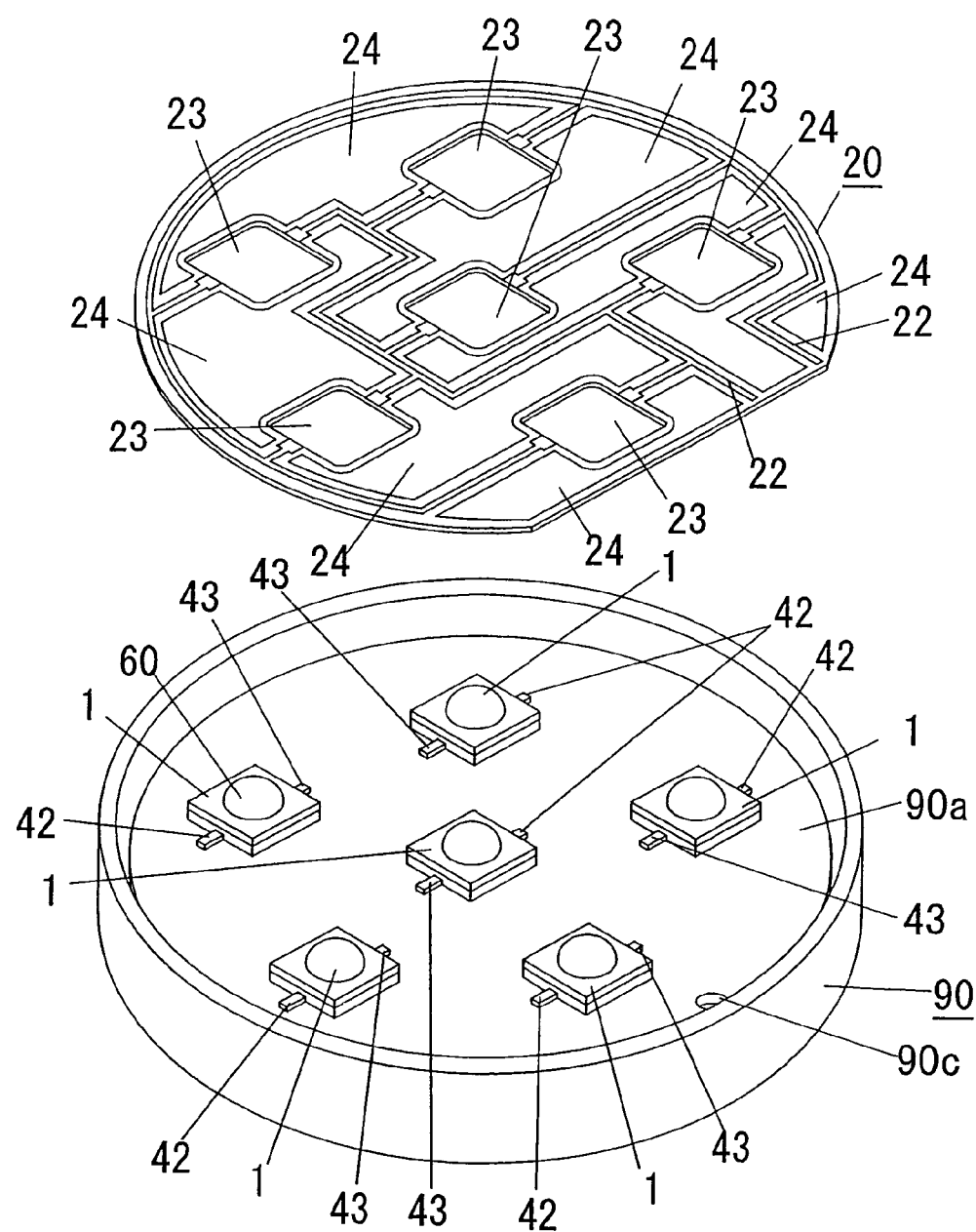
FIG. 1 is a schematic exploded perspective view of an essential part in accordance with a first embodiment.
Figure 2:
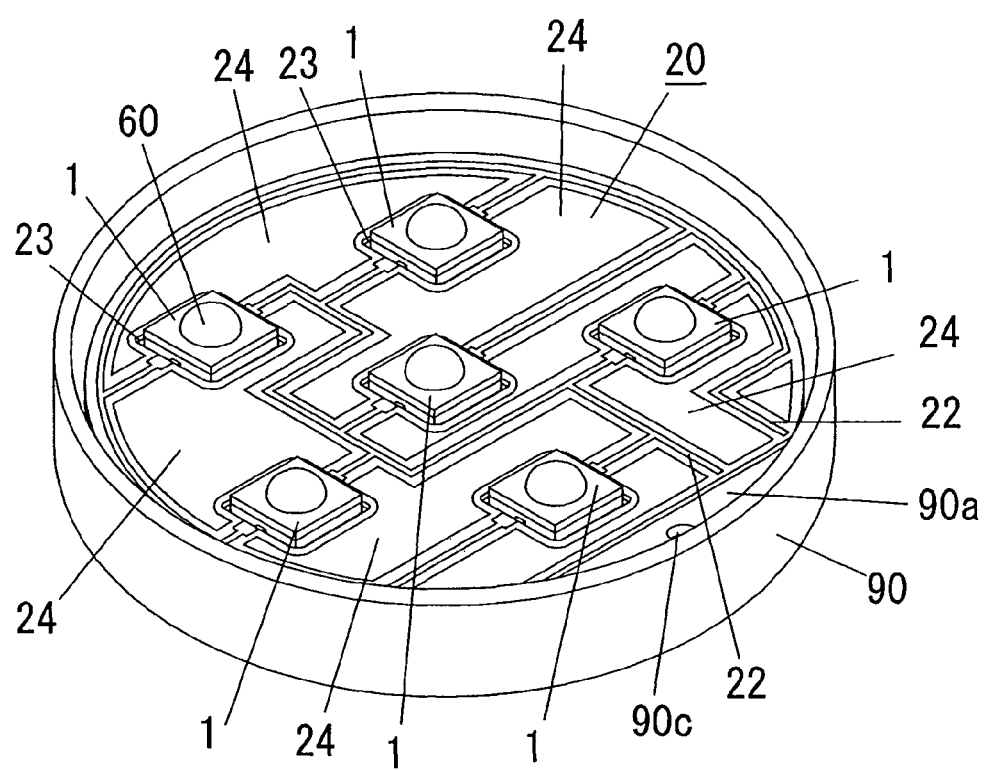
FIG. 2 is a schematic perspective view of an essential part in the above embodiment.
Figure 3:
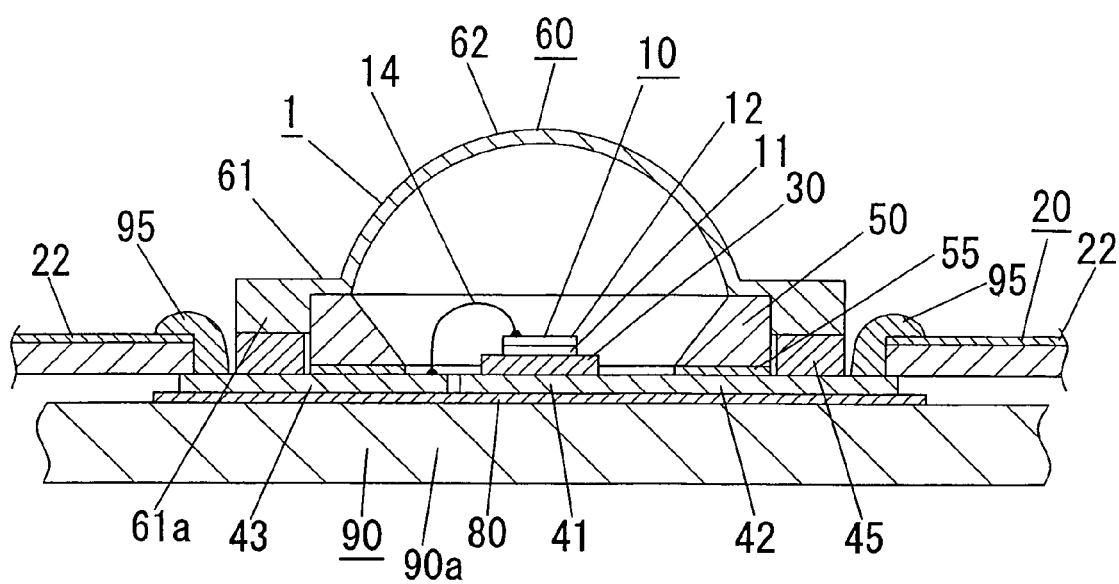
FIG. 3 is a schematic cross sectional view of an essential part in the above embodiment.
Figure 4:
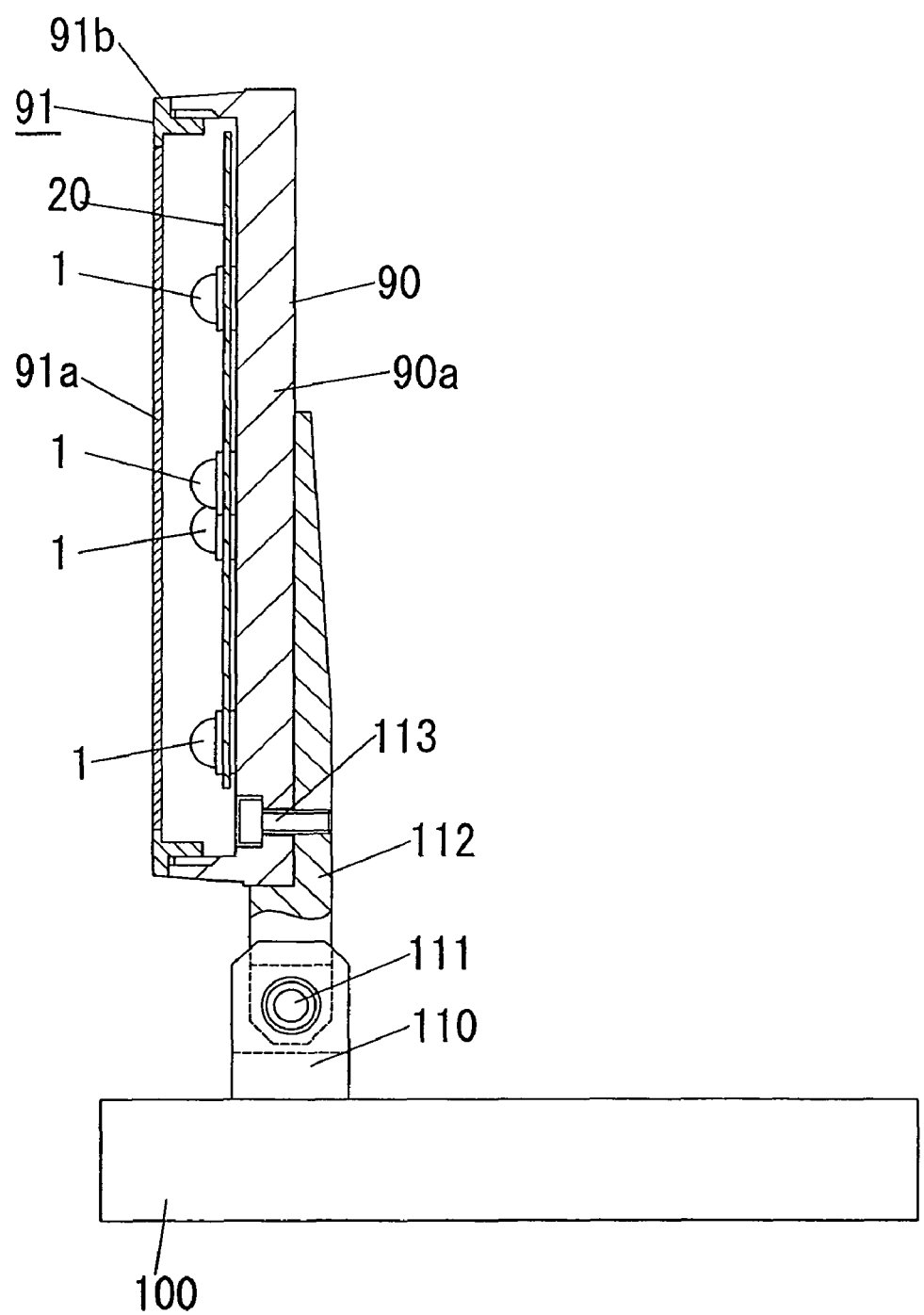
FIG. 4 is a partly broken away schematic side view in the above embodiment.
Figure 5:
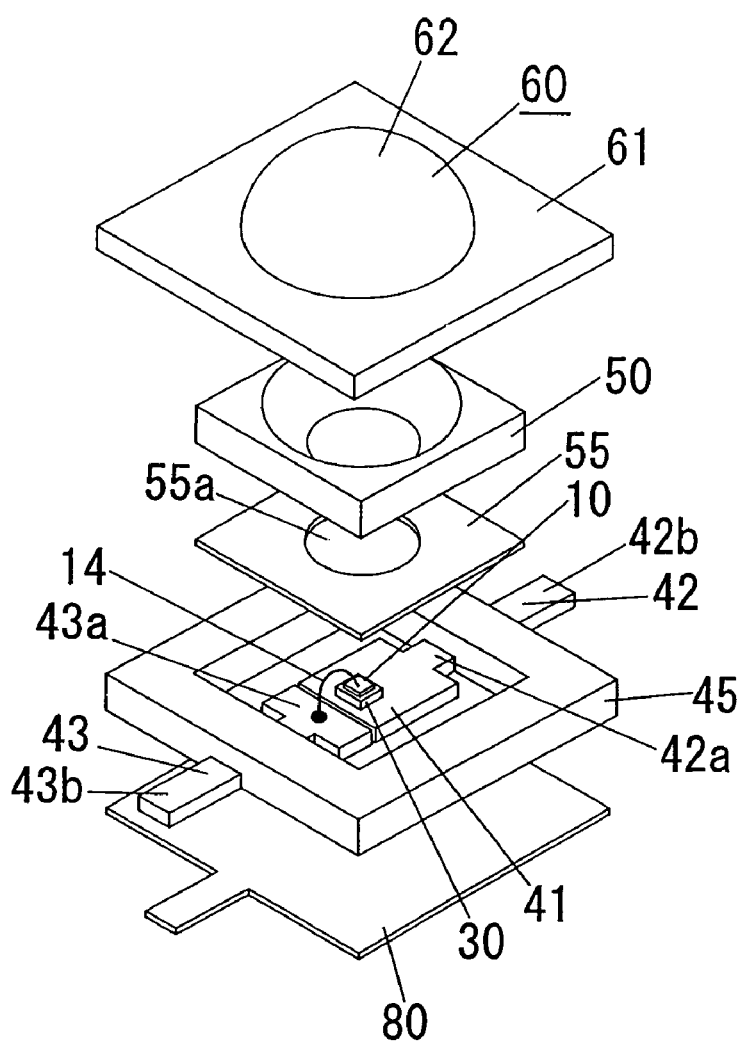
FIG. 5 is an exploded perspective view of an essential part in the above embodiment.

Hereafter, the lighting apparatus of the present embodiment will be described with reference to FIGS. 1 to 5.

The lighting apparatus of the present embodiment is used as a spot light or the like. A main body 90 is made of a metal, high thermally conductive metal such as Al and Cu, and attached by means of a bonding screw 113 to an arm 112. The arm is fixed at its one end by a shaft screw 111 to a rotatable base 110 on a supporting base 100.

The main body 90 is shaped into a bottomed tube (a bottomed cylindrical tube in the present embodiment) with an opened surface (front surface) to accommodate a plurality of LED chip units 1 (light emitting devices). In the present main body 90, each of the LED chip units 1 is mounted to a bottom wall 90a through a dielectric layer 80 made of a green sheet, and the opened surface is covered with a front cover 91. The front cover 91 includes a disk-shaped light-transmissive plate 91a made of glass plate, and a ring-shaped window frame 91b for holding the light-transmissive plate 91a, where the window frame 91b is attached to the main body 90. The dielectric layer 80 contains a filler such as silica, alumina, or the like, and is made of a thermosetting material having low viscosity when heated such as a resin sheet (e.g., the organic green sheet, such as an epoxy resin sheet highly filled with a filler including fused silica), showing high electric insulation and high thermal conductivity. This material has high flowability and adhesion to the main body 90 when heated, enabling the LED chip units 1 to be securely fixed to the main body 90. In addition, a ceramic non-sintered member, which is shaped into sheet such as green sheet, can be used for the dielectric layer 80. The material of the light-transmissive plate 91a is not limited to a glass board but may be light-transmissive one, and the light-transmissive plate 91a is formed integrally with lenses which controls an orientation of a light radiated from the respective LED chip units 1.

The respective LED chip units 1 are arranged inside the main body 90, and electrically connected through a circuit board 20 in the main body 90. The outer periphery of the circuit board 20 is shaped into a partial cut circle having a linear part.

The circuit board 20 comprises a glass epoxy board formed thereon with a circuit pattern 22 to supply an electricity to each of the LED chip units 1. A plurality of rectangular windows 23 extend through a thickness direction of the circuit board for respectively receiving therein the LED chips. In the present embodiment, the light-transmissive plate 91a forms the light-transmissive member for passing the visible light radiated from each of the LED chip units 1, and is disposed away from one surface of the circuit board 20 remote from the main body 90.

The circuit pattern 22 of the circuit board 20 is designed so as to connect the plurality of LED chip units 1 in parallel with each other. Power feeding cables (not shown) composed of lead wires are connected by solder etc. to both ends of the parallel circuit of LED chip units 1, and extend through a wire insertion hole 90c formed at the bottom wall 90a of the main body 90, for feeding electric power from a power supply circuit (not shown) to the parallel circuit of the LED chip units 1. The power supply circuit includes a rectifier circuit composed of a diode-bridge for rectifying an alternating current (AC) output from an AC source such as commercial power source; and a smoothing condenser for smoothing the output of the rectifying circuit. Although the present embodiment illustrates the parallel connection of the LED chip units 1 within the main body 90, the present invention is not limited to such electrical connection and may adopt a series electrical connection or a series-parallel combination of the LED chip units.

The LED chip unit 1 includes a rectangular plate-shaped LED chip 10; a chip mounting member 41 shaped into a rectangular plate larger than the LED chip 10 for supporting the LED chip 10; a reed-shaped lead terminal 42 formed integrally at one side edge of the chip mounting member 41; a T-shaped lead terminal 43 disposed away from the other side edge of the chip mounting member 41; a reflector 50 arranged to surround the LED chip 10, for reflecting the light radiated from the side face of the LED chip 10 towards the front side (upper side in FIG. 3) of the LED chip 10; and a protective cover 60 attached to the front side of the reflector 50 so as to cover the LED chip 10.

The chip mounting member 41 and the respective lead terminals 42, 43 are formed of a lead frame comprising a metal plate. (e.g., copper plate etc.) The chip mounting member 41 and the respective lead terminals 42, 43 are integrally formed with an insulative rectangular frame-shaped holding frame 45 comprising synthetic resin, such that inner lead portions 42a, 43a and outer ones 42b, 43b of the chip mounting member 41 are respectively arranged inside and outside the holding frame 45. The above dielectric layer 80 is interposed between the main body 90 and the lead frame including the chip mounting member 41 and the respective lead terminals 42, 43, establishing an electrical insulation and a thermally conductive coupling therebetween. The respective outer leads 42b, 43b of lead terminals 42, 43 are electrically connected to the circuit pattern 22 of the circuit board 20 through a bonding portion 95 made of solder. In the present embodiment, a package of the LED chip 10 comprises the holding frame 45, the chip mounting member 41, the individual lead terminal 42, 43, the reflector 50, the protective cover 60, and the dielectric layer 80. Furthermore, the dielectric layer 80 is provided for each LED chip unit 1 in the present embodiment, but a plurality of LED chip units 1 may be mounted together to one green sheet slightly smaller than the bottom wall 90a of the main body 90.

The material of the lead frame is not limited to copper, and may be phosphor bronze, or the like. Although the chip mounting member 41 and the respective lead terminals 42, 43 are integrally formed with the holding frame 45 in the present embodiment, the holding frame 45 is not always necessary, and the chip mounting member 41 does not require to be integrally formed with the lead terminal 42. However, when the chip mounting member 41 is integrally formed with the lead terminal 42 and the holding frame 45 is provided, each of the LED chip units 1 can be easily handled as an individual part and examined individually before mounted to the main body 90.

The LED chip 10 is a GaN-based blue LED chip emitting a blue light. The LED chip 10 includes an electrically conductive board 11 made of an electrically conductive n-type SiC having a lattice constant and a crystalline structure closer to those of GaN than sapphire. Formed on the main surface of the electrically conductive board 11 is a light emitting part 12 which is made of GaN-based semiconductive material and is obtained by an epitaxial growth (e.g. MOVPE process) to have a laminated structure, e.g. double-hetero structure. A cathode electrode (n-type electrode) (not shown) is formed on the rear side of the electrically conductive board 11 as an electrode on the side of the cathode. An anode electrode (p-type electrode) (not shown) is formed on the surface (a frontmost surface of the principle surface of the conductive board 11) of the light emitting part 12 as an electrode on the side of the anode. Although the cathode electrode and the anode electrode are each composed of the laminate of Ni film and Au film in the embodiment, materials of the cathode electrode and the anode electrodes are not particularly limited, and may be one having a good ohmic property (e.g. Al and the like).

In the present embodiment, one of the lead terminals 42 forms the cathode, and the other 43 the anode. Further, the present embodiment illustrates that the LED chip 10 is mounted to the chip mounting member 41 with the light emitting part 12 of the LED chip 10 being spaced further away from the chip mounting member 41 than from the electrically conductive board 11. In view of an optical extraction, it is desirable that the LED chip 10 is mounted to the chip mounting member 41 with the light emitting part 12 of the LED chip 10 being spaced further away from the chip mounting member 41 than from the electrically conductive board 11, as illustrated in the present embodiment. However, since the conductive board 11 has almost the same refraction index as the light emitting part 12, the optical extraction loss does not significantly increase. Therefore, the LED chip 10 may be mounted to the chip mounting member 41 with the light emitting part 12 of the LED chip 10 being spaced closer to the chip mounting member 41 than to the electrically conductive board 11.

The reflector 50 is shaped into a frame to have an opening area which becomes greater as it is spaced further away from the LED chip 10 in the thickness direction of the LED chip 10. A fixing member 55 is made of an insulative sheet-shaped adhesive film to secure the reflector 50 to the respective lead terminals 42, 43. It is noted that the reflector 50 and the fixing member 55 are respectively formed to have rectangular outer peripheral shapes slightly smaller than inner peripheral shape of the holding frame 45.

The reflector 50 may be made of a material (e.g. Al or the like) having large reflection index of the light (i.e. a blue light in this embodiment) from the LED chip 10. The fixing member 55 is formed with a circular opening 55a for receiving an opening portion of the reflector 50. In addition, a transparent encapsulation resin, such as silicon resin or the like, is preferably potted inside the reflector 50 to form an encapsulation member for encapsulating the LED chip 10.

The protective cover 60 has a dome-shaped cover member 62 centered on a center line passing in the thickness direction of the LED chip 10, and a flange 61 arranged to laterally extend from the periphery of an opening portion of the dome-shaped cover 62. The flange 61 is provided with an annular rib 61a at the periphery of its surface opposing the reflector 50 for stably positioning the protective cover 60 to the reflector 50. The protective cover 60 is necessarily attached to the reflector 50 by an adhesive agent such as silicone resin, epoxy resin, or the like.

The protective cover 60 is molded from a mixture of a transparent material, e.g. silicone resin and a particulate yellowish fluorescent material which is excited by the blue light from the LED chips 10 to emit a broad-band yellowish light. In the LED chip units 1 of this embodiment, the protective cover 60 acts also as a color conversion member excited by a light from the LED chips 10 to emit a light of a color different from a luminescent color of the LED chips 10, outputting a white color light by a combination of the blue light from LED chip 10 and the light from the yellowish fluorescent material as a whole of the LED chip units 1. As the material of the protective cover 60, the transparent material is not limited to the silicone resin, and may be one such as acryl resin, epoxy resin, and glass. Additionally, the fluorescent material mixed with the transparent material of the protective cover 60 is not limited to the yellowish fluorescent material. For instance, the white color light can be obtained by a mixture of other fluorescent materials such as reddish and greenish ones. Furthermore, the fluorescent material is not necessary to be mixed with the transparent material when each of the LED chips 10 emits a light of a desired color of LED chip unit 1.

Although the present embodiment employs the blue-light LED chips with the blue luminescence as the LED chips 10 and the SiC board as the electrically conductive board 11, a GaN board may be used instead of the SiC board. The use of the SiC board and the GaN board as a crystal growth board enables to increase thermal conductivity and lower the thermal resistance thereof, in comparison with the use of a dielectric sapphire board as the crystal growth board, as shown in Table 1 below and disclosed in Japanese Patent Publications No. 2003-168829. Further, the luminescent color of the LED chip 10 is not limited to be blue, and may be red, green or the like. Namely, a material of light emitting part 12 of the LED chip 10 is not limited to a compound of GaN-based semiconductive material, and may be a compound of GaAs-based, GaP-based semiconductive material, or the like, depending on the luminescent color of the LED chip 10. Besides, the electrically conductive board 11 is not limited to SiC board, and may be optionally selected from GaAs board, GaP board, or the like, depending on the material of the light emitting part 12.

TABLE 1

| Crystal growth board | Thermal conductivity [W/m · K] | Linear coefficient of thermal expansion [×10$^{-6}$/K] | Thermal resistance [K/W] |
|---|---|---|---|
| 6H—SiC | 350 | 4.2 | 0.857 |
| GaN | 130 | 5.59 | 2.308 |
| GaP | 110 | 4.65 | 2.727 |
| GaAs | 54 | 5.9 | 5.556 |
| Sapphire | 42 | 5.3 | 7.143 |

Table 1 shows experimental thermal resistances measured when making thermal conduction in a thickness direction of a crystal growth board having a thickness of 0.3 mm and a cross section area of 1 mm$^2$ perpendicular to the thickness.

The LED chip 10 is mounted to the chip mounting member 41 with a rectangular plane-shaped sub-mount member 30 interposed therebetween. The sub-mount member 30, larger than the LED chip 10, does not only relieve a stress applied to the LED chip 10 due to a difference in linear expansion coefficient between the LED chip 10 and the chip mounting member 41 acting also as a thermally conductive plate, but also conduct a heat generated in the LED chip 10 to the chip mounting member 41 for transmitting the heat over a wider area than that of the LED chip 10. It is desirable that the surface area of the chip mounting member 41 opposing the LED chip 10 is sufficiently larger than that of the LED chip 10 opposing the chip mounting member 41. A contact area is preferably enlarged so as to lower the thermal conductivity between 41 and 80 for uniformly conducting over a wide area, enabling to efficiently dissipate the heat from the LED chip 10. For the LED chip 10 of 0.3-1.0 mm square, the surface area of the chip mounting member 41 opposing the LED chip 10 is preferably more than ten times that of the LED chip 10 opposing the chip mounting member 41. Herein, the sub-mount member 30 is required to alleviate the stress. When the sub-mount member 30 meets the requirement, it may be thin or made of a relatively high thermally conductive material to reduce the thermal resistance.

In the present embodiment, CuW is used for the material of the sub-mount member 30. The LED chip 10 is provide with the cathode electrode electrically connected to the inner lead portion 42a of one lead terminal 42 through the sub-mount member 30 and the chip mounting member 41, and the anode electrode electrically connected to the inner lead portion 43a of the other lead terminal 43 through a bonding wire 14 made of metal thin wire (e.g., gold thin wire, aluminum thin wire, or the like). The circuit pattern 22 is electrically connected to the respective outer lead portions 42b, 43b of the lead terminals 42, 43 by means of the bonding portion 95 made of solder.

The material of the sub-mount member 30 is not limited to CuW, but may be a material having the linear coefficient of thermal expansion relatively close to that of the conductive board 11 made of 6H—SiC and relatively high thermal conductivity such as W, AlN, complex SiC, Si, or the like, as listed in table 2 below. However, when an insulator such as AlN or complex SiC is used for the sub-mount member 30, a conduct pattern needs to be arranged on the surface of the sub-mount member 30 facing the LED chip 10 for jointing to the anode electrode, and electrically connected to the inner lead 42a of one lead terminal 42 by means of the bonding wire.

TABLE 2

| | Material | Linear coefficient of thermal expansion $[\times 10^{-6}/K]$ | Thermal conductivity $[W/m \cdot K]$ |
|---|---|---|---|
| Crystal growth board | 6H—SiC | 4.2 | 350 |
| | GaN | 5.59 | 130 |
| | GaP | 4.65 | 110 |
| | GaAs | 5.9 | 54 |
| | Sapphire | 5.3 | 42 |
| Sub-mount member | Al | 23.2 | 237 |
| | Cu | 16.6 | 398 |
| | W | 4.5 | 178 |
| | CuW | 6.4 | 160 |
| | Si | 2.6 | 168 |
| | AlN | 4.6 | 165 |
| | Alumina | 7.1 | 29 |
| Adhesive material | Au | 14.2 | 315 |
| | 63Sn—37Pb | 21.0 | 50 |
| | Silver paste | 70.0 | 1.1 |

Herein, when Cu is used as the chip mounting material 41, CuW or W is adopted as the sub-mount member 30 for directly bonding the sub-mount member 30 to the chip mounting material 41, enabling to enlarge a bonding area and reduce the thermal resistance between the sub-mount member 30 and the chip mounting material 41, compared to brazing therebetween, as shown in Table 3 below. It is noted that a solder for bonding the LED chip 10 to the sub-mount member 30 is made of a Pb-free material such as AuSn, SnAgCu, or the like.

TABLE 3

| | Brazing | Direct Bonding |
|---|---|---|
| Bonding Area | 60%-80% | Substantially 100% |
| Bonding Strength | 98 N/mm² or more | 127 N/mm² or more |
| Shear Strength | 98 N/mm² | 127 N/mm² |
| Bonding portion | Flux may remain thereon | |

In addition, W can be employed as the sub-mount member 30 for directly bonding to the chip mounting 41, enabling to enlarge the thermal conductivity and reduce the thermal resistance, compared to bonding by means of Ag brazing, as shown in Table 4 below. When the material of the chip mounting 41 is Cu and that of the sub-mount member 30 selected among AlN, complex SiC, and the like, the solder is essentially made of a Pb-free material, such as AuSn, SnAgCu, or the like, for bonding the chip mounting 41 to the sub-mount member 30.

TABLE 4

| | Ag brazing | Direct Bonding |
|---|---|---|
| Thermal conductivity [W/m · K] | 185.4 | 211.8 |

In the present embodiment, the lighting apparatus using LEDs is provided with a mirror 24 formed of a reflection film (e.g. a metal film such as Al film or the like) reflecting a visible light, on the surface of the circuit board 20 opposing a light-transmissive plate 91a. Since the mirror 24 reflects thereon the visible light suffering from a total reflection on the light-transmissive plate 91a after being emitted from each of the LED units 1, the mirror 24 enables to enhance the light output, compared to the apparatus without the mirror 24. Herein, the circuit pattern 22 and the mirror 24 are individually provided on the surface of the circuit board 20 opposing the light-transmissive plate 91a, increasing the degree of freedom for designing the circuit pattern 22. It is enabled that materials can be optionally selected for the circuit pattern 22 and the mirror 24, thereby enabling to further enhance the light output by selecting a material having the high reflectivity for the mirror 24. For instance, the material of the mirror 24 using Al offers the higher reflectivity of the light in the visible region and light output than using Ni. Although Au is adopted as the material of the circuit pattern 22 in this embodiment, the material is not limited to Au, but may be Cu or the like.

In the lighting apparatus with LEDs of the present embodiment described above, the heat generated in each LED chip unit 1 can be conducted to the metal-made main body 90 through the dielectric layer 80 such as a green sheet not through the circuit board. The conventional lighting apparatus includes the circuit board thermally coupled to the bottom of the lighting apparatus with a dielectric material interposed therebetween. Compared to the conventional apparatus, the present embodiment is configured to lower a distance and reduce thermal resistance between the light emitting part 12 of the LED units 10 and the main body 90, enhancing the thermally conductive performance to reduce the rise in the junction temperature of the light emitting part 12, and thereby allowing the input power to be increased for achieving the high light output. Moreover, compared to the conventional lighting apparatus with LEDs, the present invention enables to suppress the rise in junction temperature of the LED chip 10, extending a lifetime of the LED chip 10 for achieving the same light output.

Furthermore, the present lighting apparatus does not require a metal board (metal-base printed circuit board) used in the conventional scheme as the circuit board 20, enabling to adopt a less expensive circuit, such as glass epoxy board or the like, than the metal circuit 20 for reducing the cost of the circuit board 20.

When the difference in linear coefficient of thermal expansion is small between the LED chip 10 and the chip mounting member 41, the sub-mount member 30 is not required to be interposed between the LED chip 10 and the chip mounting member 41. The lighting apparatus without the sub-mount member enables to shorten the distance between the LED chip 10 and the bottom wall 90a of the metal-made main body 90, reducing the thermal resistance between the emitting part 12 of the LED chip 10 and the main body 90, and whereby improving its thermally conductive performance to realize further high light output.

Second Embodiment

Figure 6:
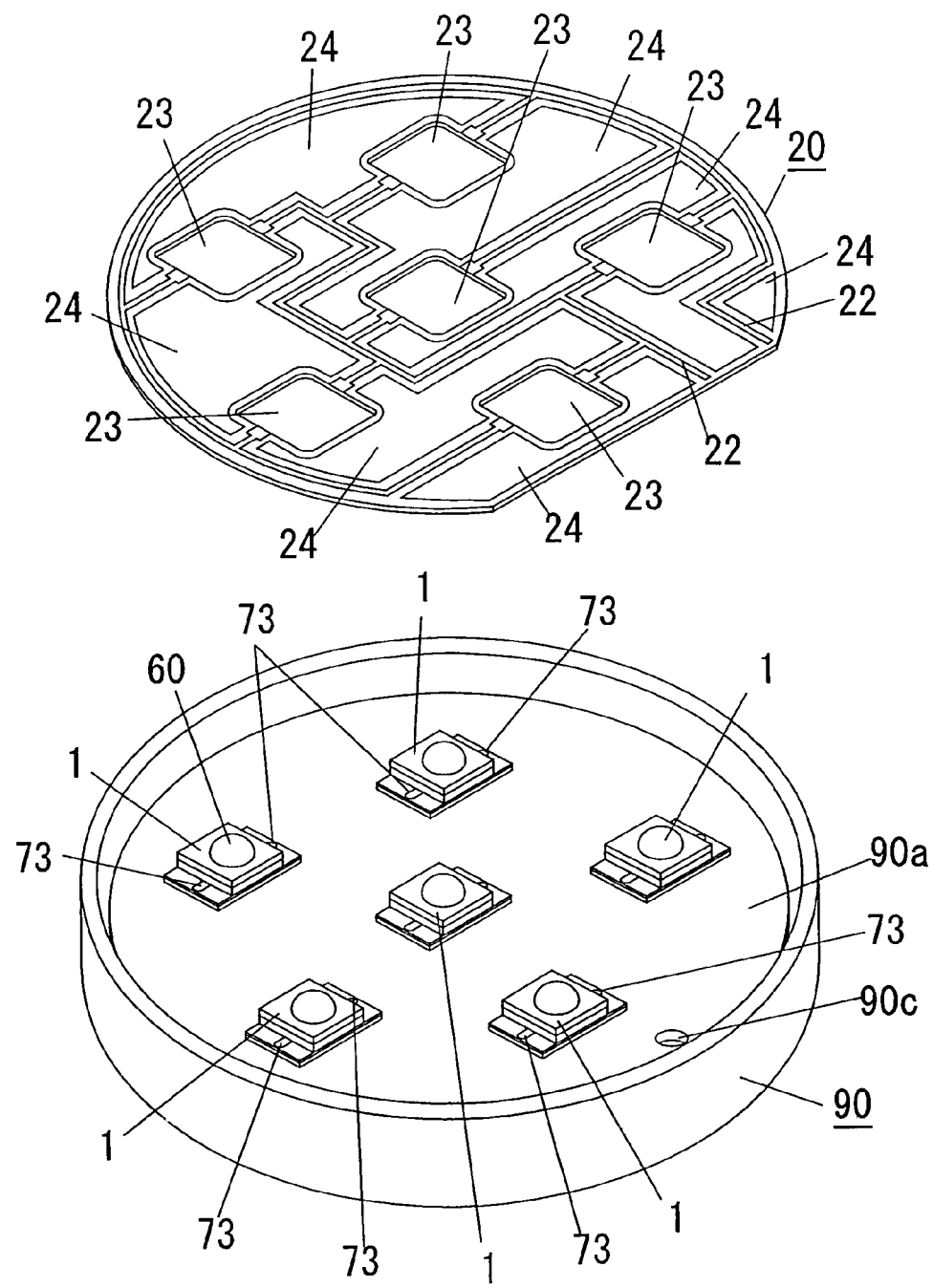
FIG. 6 is a schematic exploded perspective view of an essential part in accordance with a second embodiment.
Figure 7:
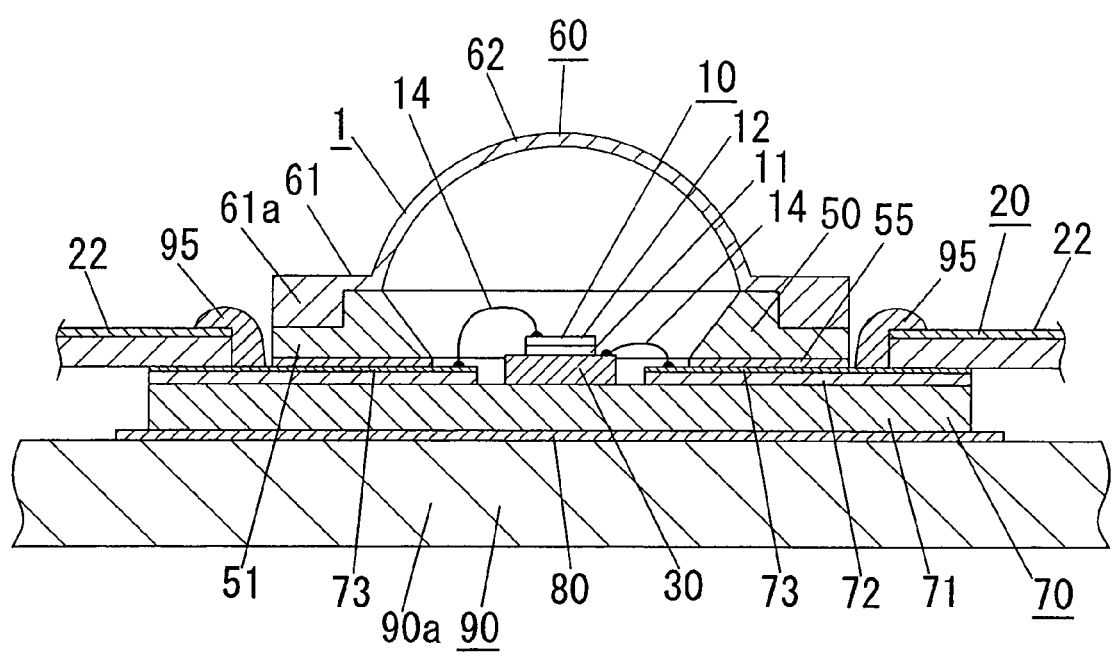
FIG. 7 is a schematic cross sectional view of an essential part in the above embodiment.
Figure 8:
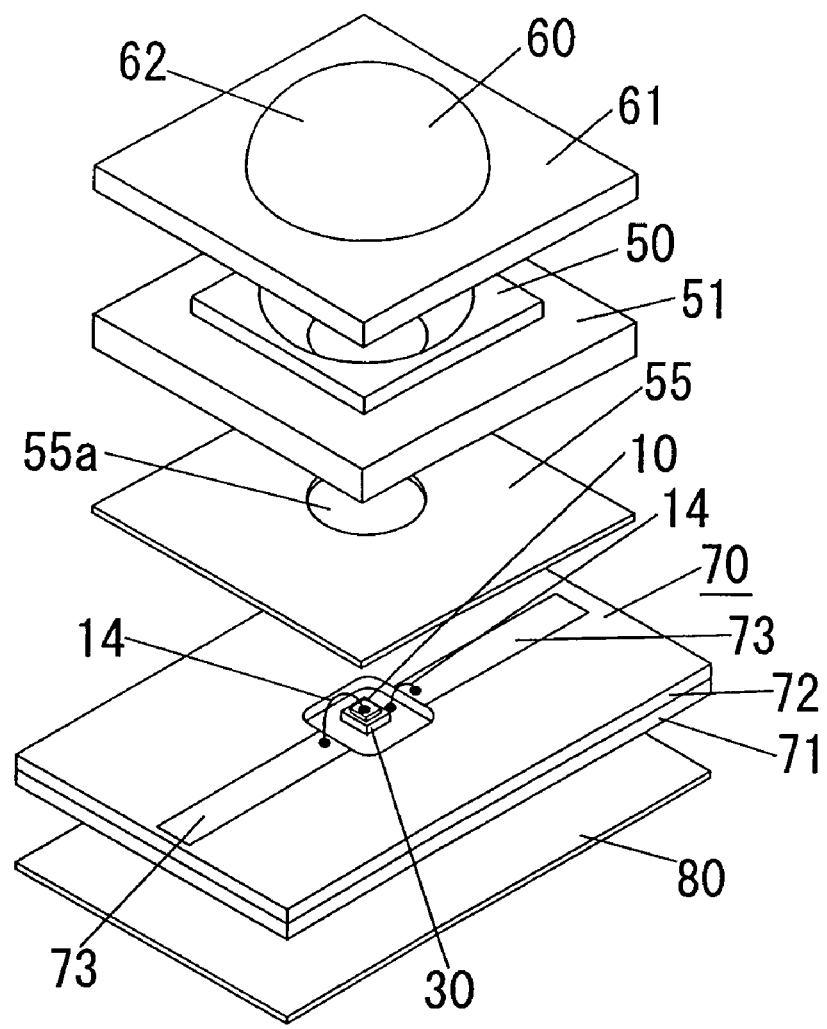
FIG. 8 is a schematic exploded perspective view of an essential part in the above embodiment.

The light apparatus with LED of this embodiment has almost the same configuration as that of first embodiment. As shown in FIGS. 6 to 8, the LED chip unit 1 in the present embodiment is different from that of first embodiments. Like components as that of the first embodiment are designated by like reference numerals, and no duplicate explanation deemed necessary. The front cover 91 (see FIG. 4) is provided in this embodiment as well as the first embodiment.

Instead of the chip mounting member 41, the respective lead terminals 42, 43, and the holding frame 45 used in the first embodiment, the present embodiment employs a mounting board (chip mounting member) 70 which is composed of a rectangular plate-shaped conductive plate 71 carrying on its surface the LED chip 10, and a dielectric film 72 superimposed on the conductive plate 71 and being formed on its surface with patterned lead terminals 73, 73 respectively for connection with the anode and cathode electrodes of the LED chip 10. The conductive plate 71 is placed between the sub-mount member 30 carrying the LED chip 10 and the dielectric layer 80 mounted on the bottom wall 90a of the main body 90. The conductive plate 71 is essentially made of a material having relatively high thermal conductivity such as copper, phosphor bronze, or the like. The material of the lead terminals 73, 73 may be copper or the like. A material of the conductive plate 71 needs to have an almost the same thickness as the lead frame mounting the LED chip 10, and thus the thickness dimension can be reduced compared to that of the circuit board in the LED unit disclosed in the related art.

In the present embodiment, a mounting unit 51 is integrally formed with the reflector 50 for receiving an annular positioning rib 61a which extends from the flange 61 of the protective cover 60 so that the protective cover 60 can be stably positioned with respect to the reflector 50.

Furthermore, in the present embodiment, the anode electrode (not shown) on one surface (top surface in FIG. 7) of the LED chip 10 is electrically connected to one end (inner lead portion) of one lead terminal 73 through the bonding wire 14, the cathode electrode (not shown) on the other side (bottom side in FIG. 7) of the LED chip 10 is electrically connected to one end (inner lead portion) of the other lead terminal 73 through the bonding wire 14, and the other ends of the respective lead terminals 73 are electrically connected to the circuit pattern 22 of the circuit board 20 through the bonding portion 95 made of solder. In the present embodiment, a package of the LED chip 10 is composed of the chip mounting member 70, the reflector 50, and the protective cover 60.

Compared to the prior art, the lighting apparatus with LEDs in the present embodiment enables to reduce the thermal resistance between the light emitting part 12 of the LED chip 10 and the main body 90, enhancing thermally conductive performance, and thereby suppressing the rise in the junction temperature of the LED chip 10, as well as the first embodiment. This configuration allows the input electric power to be increased for realizing high light output. The cost of the circuit board 20 can be reduced by utilizing a less expensive circuit board, such as glass epoxy board, than the metal board.

When the difference is relatively small in linear coefficient of thermal expansion between the LED chip 10 and the conductive plate 71, the sub-MEW mount member 30 is not required to be interposed between the LED chip 10 and the conductive plate 71 of the chip mounting member 70. The lighting apparatus without the sub-mount member 30 enables to shorten the distance between the LED chip 10 and the bottom wall 90a of the metal-made main body 90, reducing the thermal resistance between the emitting part 12 of the LED chip 10 and the main body 90, and whereby improving its thermally conductive performance to realize the further high light output.

The present embodiment also enables each of the LED chip units 1 to be easily handled as an individual component and individually examined before mounted to the main body 90.

Third Embodiment

Figure 9:
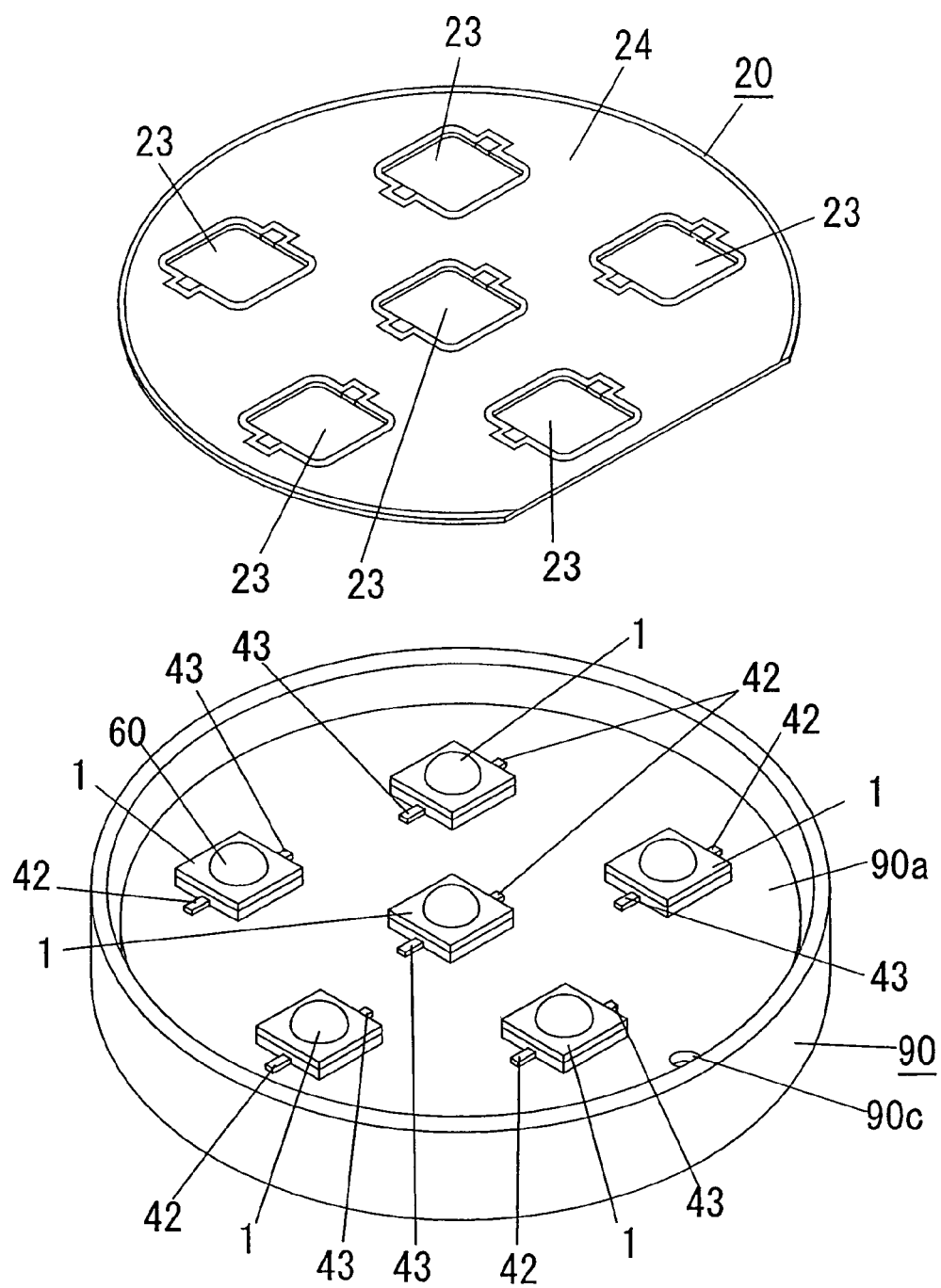
FIG. 9 is a schematic exploded perspective view of an essential part in accordance with a third embodiment.
Figure 10:
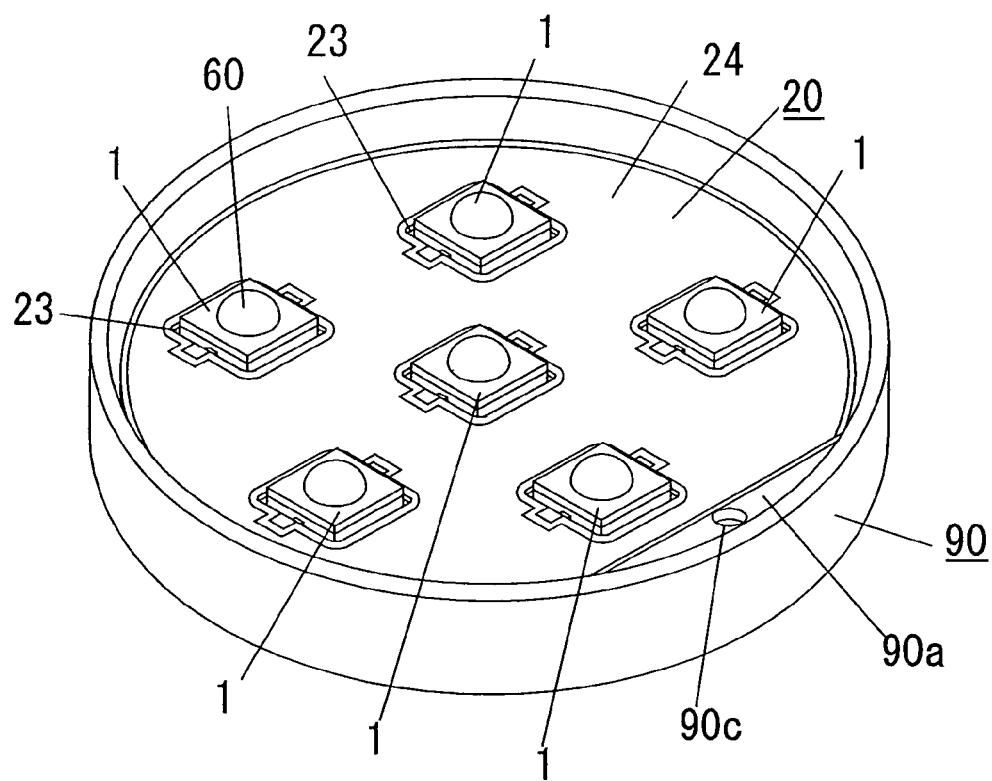
FIG. 10 is a schematic perspective view of an essential part in the above embodiment.
Figure 11:
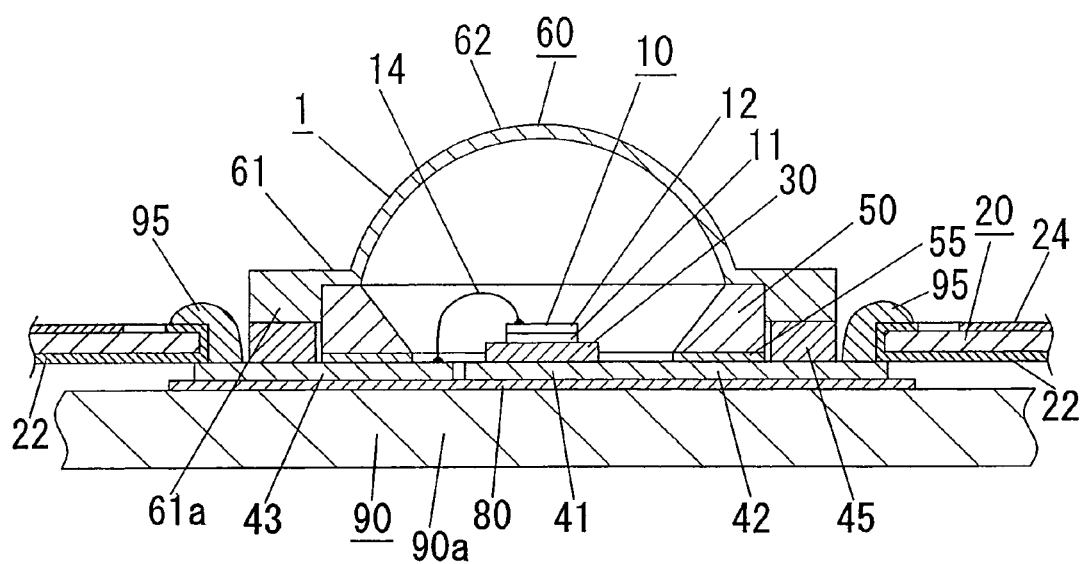
FIG. 11 is a schematic cross sectional view of an essential part in the above embodiment.

The configuration of a lighting apparatus with LEDs in the present embodiment is almost the same as that in first embodiment. The configuration of the circuit board 20 in the present embodiment is different from that in first one, as shown in FIGS. 9 to 11. Like components as that of the first embodiment are designated by like reference numerals, and no duplicate explanation deemed necessary. The front cover 91 (see FIG. 4) is provided in this embodiment as well as the first one.

In this embodiment, the circuit pattern 22 extends from one surface to the other surface of the circuit board 20 opposing the light-transmissive plate 91a (see FIG. 4) through the periphery of the window 23 to form thereof a bonding area 95 where the circuit pattern 22 is electrically connected to lead terminals 42, 43 of the LED chip unit by bonding material such as a solder.

Compared to the first embodiment, the lighting apparatus with LEDs of this embodiment can be formed so as to enlarge an area of the mirror 24 on the surface of the circuit board 20 facing the light-transmissive plate 91a, enabling to further enhance the high light output. The circuit board 20 of the second embodiment may be replaced with that of this embodiment.

Fourth Embodiment

A lighting apparatus with LEDs of the present embodiment will now be described with reference to FIGS. 12 to 25. Like components as that of the first embodiment are designated by like reference numerals, and no duplicate explanation partially deemed necessary.

Figure 25:
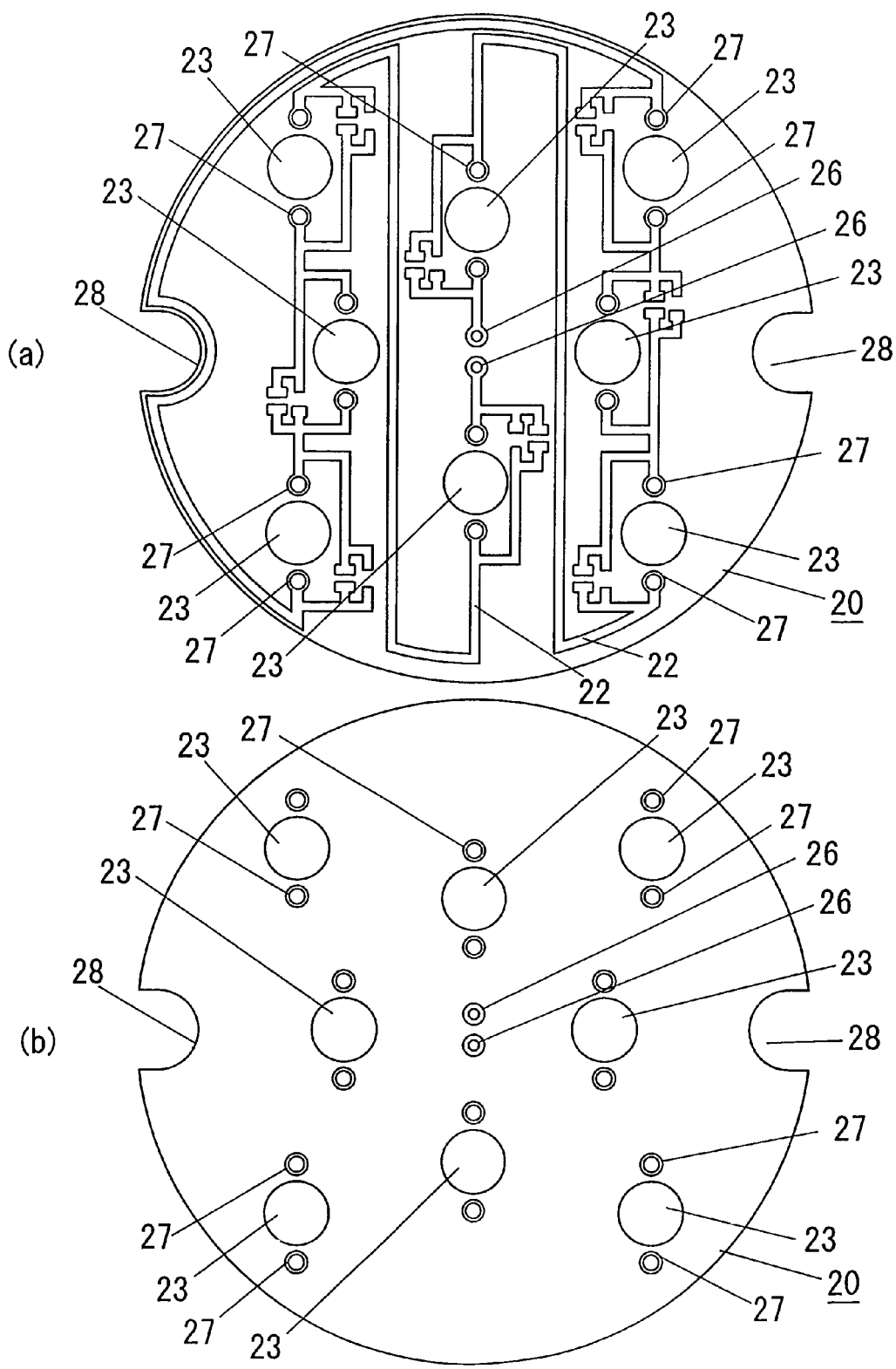
FIG. 25 shows a circuit board in the above embodiment, where (a) is a plan view and (b) is a bottom view.

The lighting apparatus with LEDs in the present embodiment is a ceiling light including a main body 190 made of a metal (e.g., a highly thermally conductive metal such as Al, Cu, or the like), and attached to a supporting material 180 such as a ceiling structure. As shown in FIGS. 12 to 15, the main body 190 is formed into a disk-shaped and provided with a circular opening recess 191 on a surface (a bottom surface of FIG. 12(a)) of the main body 190 remote from the supporting material 180. At an inner bottom surface of the recess 191, a dent 192 is provided for receiving a plurality of (eight in the present embodiment) the LED chip units 1 and the circular plate-shaped circuit board 20. Herein, the circuit board 20 is formed with a plurality of (eight in the present embodiment) circular windows 23 (see FIG. 25) for partially receiving the respective LED chip units 1. The circuit board 20 is formed with the circuit pattern 22 (see FIG. 25(a)) for supplying electric power to the LED chip unit 1 on its surface opposing the inner bottom face of the dent 192, and disposed on the same side of the main body 190 as each LED chip unit 1. The circuit pattern 22 in FIG. 25(a) is formed so as to connect in series with eight LED chip units 1.

The main body 190 is formed at the center of its other face (top face of FIG. 12(a)) with a cylindrical implant part 193 projecting from the main body 190 to be inserted into a circular attachment hole 181 in the supporting material 180. The main body 190 is provided with a wire insertion hole 194 extending from a front edge surface of the implant part 193 and the center of the inner bottom face of the dent 192. The wire insertion hole 194 can guide power feeding cables 96, 96 for feeding electric power to the circuit board 20, into the dent 192. In other words, the wire insertion hole 194 is formed at the bottom of the dent 192 in main body 190. For receiving an electric power from another power supply unit (not shown), second connectors 97 are removably connected with a first connector at its opposite end to the respective power feeding cables 96, 96 leading to the circuit board 20.

A pair of power feeding through holes 26, 26 (see FIG. 25) is formed at the center of the circuit board 20 to electrically connect to the power feeding cables 96, 96. Each of the power feeding through holes 26, 26 is formed to cover its inner surface as well as the periphery thereof for connecting the power feeding cables 96, 96 by means of a solder. This arrangement does not necessitate a space for drawing the power feeding cables 96, 96 within the dent 192 of the main body 190, thinning the main body 90. Each of the power feeding through holes 26, 26 is electrically connected to the circuit pattern 22 on the surface of the circuit board 20.

The LED chip unit 1 will now be described with reference to FIGS. 20 to 24.

The LED chip unit 1 includes the LED chip 10; a mounting board 120 to which the LED chip 10 is mounted; a flame body 140 arranged to surround the LED chip 10 on the same side of the mounting board 120 as the LED chip 10 being supported; bonding wires 14, 14 connected to the LED chip 10; an encapsulation member 150 formed of a light-transmissive material (an encapsulation resin) to encapsulate the LED chip 10 and the bonding wires 14, 14 inside the flame 140; a lens 160 arranged to cover the encapsulation member 150 and the flame 140; and a dome-shaped color conversion member 170 molded from the transparent material and the fluorescent material excited by a light from the LED chip 10 to emit a light of a color different from a luminescent color of the LED chip 10. The color conversion member 170 is arranged over the lens to form an air layer 180 between a light output surface 160b of the lens 160 and an outer surface of the flame 140.

The mounting board 120 includes a metal plate 121 and a dielectric board 122 made of a glass epoxy (FR4) board and superimposed on the metal plate 121. The dielectric board 122 is provided with a pair of terminal patterns 123, 123 comprising conductive patterns electrically connected to the respective electrodes (not shown) of the LED chip 10. The dielectric board 122 is formed with a hole 124 at its portion corresponding to the LED chip 10. Although Cu is adopted as a material of the metal plate 121 in the present embodiment, the material is not limited to Cu, but may be metallic one having a relatively high thermal conductivity such as Al. In the LED chip unit 1 in this embodiment, the metal plate 121 forms a thermally conductive plate which is made of a thermally conductive material and supports the LED chip 10. The terminal patterns 123, 123 respectively form lead terminals electrically connected to the respective electrodes of the LED chip 10.

The dielectric board 122 is mounted on the metal plate 121 by means of a bonding metal layer 125 (see FIGS. 20 and 24), which is made of metal (Cu in the present embodiment) and formed on a surface of the dielectric board 122 opposing the metal plate 121. Each of the lead patterns 123, 123 is composed of a laminate of Cu film, Ni film and Ag film. A resist layer 126 (see FIG. 24) is made of a whitish resin and provided on the surface of the dielectric board 122 remote from the metal plate 121 so as to cover each of the lead patterns 123, 123. The resist layer 126 is provided at its center with a circular window 126a for exposing inner lead portions 123a, 123a of both lead patterns 123, 123, and at its periphery with circular windows 126b, 126b for exposing respective outer lead portions 123b, 123b of lead patterns 123, 123.

The LED chip 10 is mounted to the above metal plate 121 with the rectangular plane-shaped sub-mount member 30 interposed therebetween. The sub-mount member 30, larger than the LED chip 10, does not only relieve the stress applied to the LED chip 10 due to the difference in linear expansion coefficient between the LED chip 10 and the metal plate (thermally conductive plate) 121, but also thermally conduct the heat generated in the LED chip 10 to the metal plate 121 for transmitting the heat over a wider area than that of the LED chip 10. In the embodiment, AlN is adopted as the material of the sub-mount member 30 because of its relatively high thermal conductivity and insulating performance. The sub-mount member 30 is provided on its surface opposing the LED chip 10 with the cathode electrode electrically connected to one of the lead patterns 123 through the conductive pattern 31 (see FIG. 23) and the bonding wire 14 composed of metal thin wire 14 (e.g., gold thin wire, aluminum thin wire, or the like). The anode electrode is electrically connected to the other of the lead patterns 123 by means of the bonding wire 14. It is noted in this connection that, although the LED chip 10 and the sub-mount member 30 can be joined by a solder such as SnPb, AuSn, SnAgCu, or a silver paste, they are preferably joined by use of a lead free (Pb-free) solder such as AuSn, SnAgCu. In addition, the sub-mount member 30 is also provided at the periphery of the conductive pattern 31 with a reflection film 32 (e.g. a laminate of Ni film and Au film) for reflecting the light emitted from the LED chip 10.

The material of the sub-mount member 30 is not limited to AlN, and may be one (e.g. composite SiC, Si, or and the like) having the linear thermal expansion coefficient relatively close to that of an electrically-conductive board 11 made of 6H—SiC, and relatively high thermal conductivity. Since the LED chip 10 is mounted to the metal plate 121 with the sub-mount member 30 interposed therebetween in the present embodiment, the heat generated in the LED chip 10 can be radiated efficiently through the sub-mount member 30 and the metal plate 121, while it is made to relieve the stress applied to the LED chip 10 due to the difference in linear expansion coefficient between the LED chip 10 and the metal plate 121.

Silicon resin is used as the light-transmissive material of the encapsulation member 150 in this embodiment, but the material is not limited to silicon resin, but may be acryl resin or the like.

The frame body 140 has a cylindrical shape and includes a molded article of transparent resin, where silicon resin is used as the transparent resin for the molded article. Namely, in the present embodiment, the frame body 140 is formed of the light-transmissive material having almost the same linear coefficient of thermal expansion as that of the encapsulation member 150. In the present embodiment, light-transmissive material of the encapsulation member 150 is potted within the flame body 140 and then heat-cured to form the encapsulation member 150, subsequent to fixing the frame body 140 to the mounting board 120. When an acryl resin is used as the light-transmissive material of the encapsulation member 150 instead of the silicon resin, the frame body 140 is preferably formed of a molded article of acryl resin. The frame body 140 is preferably arranged on one surface of the dielectric board 122 remote from the metal plate 121 so as to surround the LED chip 10 and the sub-mount member 30.

The lens 160 is shaped into a biconvex lens to have a convex-shaped light output surface 160b and a light input surface 160a opposing the encapsulation member 150. Although the lens 160 is composed of a molded article of silicon resin and has the same refraction index as the encapsulation member 150 in this embodiment, the lens 160 is not limited to the molded article of silicon resin and may be that of acryl resin.

The light output surface 160b of the lens 160 is shaped into a convex surface such that an interface between the light output surface 160b and the air layer 180 is free from a total reflection of the light radiated from the light input surface 160a. Herein, the lens 160 is arranged such that its optical axis coincides with the line passing through the center of the light emitting part 12 along thickness direction of LED chip 10. The present configuration allows the light emitted from the LED chip 10 to pass through the color conversion member 170 without exciting or colliding to the fluorescent material in the color conversion member 170, subsequent to traveling through the encapsulation material 150 and the air layer 180.

The color conversion member 170 is molded from a mixture of the transparent material (e.g. silicone resin) and the particulate yellowish fluorescent material. The fluorescent material is excited by the blue light, which is emitted from the LED chip 10 and then passes through the encapsulation material 150, enabling to emit a broad-band yellowish light. The LED chip unit 1 in this embodiment is configured to radiate the blue light from the LED chip 10 and the light from the yellowish fluorescent material through the outer surface 170b of the color conversion member 170, enabling to obtain white color light. As the material of the color conversion member 170, the transparent material is not limited to the silicone resin, and may be one such as acryl resin, epoxy resin, and glass. Additionally, the fluorescent material mixed with the transparent material of the color conversion member 170 is not limited to the yellowish fluorescent material. For instance, the white color light can be obtained by a mixture of other fluorescent materials such as reddish and greenish ones.

The color conversion member 170 is formed to fit to the light output surface 160b of the lens 160 such that an inner surface 170a of the color conversion member 170 is spaced from the light output surface 160b of the lens 160 by an almost uniform distance, and configured to have a constant wall thickness over the entire surface. The color conversion member 170 may be secured at a periphery of its opening side to the mounting board 122 by an adhesive agent (e.g. silicone resin, epoxy resin).

The LED chip unit 1 in this embodiment, the sub-mount member 30 is shaped into a plane-like form having a larger horizontal size than that of the LED chip 10, and provided with the reflector film 32 at the periphery of the conductive pattern 31, that is, bonding portion to the LED chip 10. The reflector film 32 is configured to reflect the light from a lateral side of the LED chip 10, and have a thickness such that its surface is spaced further away from the metal plate 121 than the edge of the color conversion member 170 opposing the dielectric board 122, preventing the dielectric board 122 from absorbing the light radiated from the lateral side of the LED chip 10, enabling to improve a light extraction efficiency to the device. Furthermore, the reflector film 32 does not allow the light, which is radiated from the lateral side of the LED chip 10, to travel outward through the bonding portion between the color conversion member 170 and the dielectric board 122, suppressing a color unevenness of the LED chip units, thereby enabling to enhance the light output for improving a light extraction efficiency to the device.

In this embodiment, the LED chip 10 is mounted at the center of the sub-mount member 30 such that each side of the LED chip 10 perpendicularly intersects one of the diagonal lines of the sub-mount member 30 in horizontal view, allowing the reflector 32 to efficiently reflect the light emitted from the lateral surfaces of the LED chip 10 toward the sub-mount member 30, thereby enabling to enhance the light output for improving a light extraction efficiency to the device. In the present embodiment, the LED chip 10 and the sub-mount member 30 are arranged to have a common center axis along the thickness direction with the individual diagonal lines of the LED chip 10 crossing at an angle of 45 degrees with that of the sub-mount member 30. In the present embodiment, since the mounting board 120 comprises a laminate structure of the dielectric board 122 superimposed on the metal plate 121, as described above, lengthening an insulation distance between the main body 190 and the lead terminals 123, 123, and whereby improving its reliability, compared to the first embodiment.

In the LED chip unit 1 of the present embodiment, as being arranged so as to form the air layer 180 between the light output surface 160b of the lens 160 and the frame body 140 while being out of intimate contact with the lens 160, the color conversion member 170 assures to avoid a lowered yield which would otherwise result from dimensional inaccuracy of the color conversion member 170 or positioning inaccuracy thereof. Furthermore, in the LED chip unit 1 of this embodiment, the color conversion member 170 assures to avoid a lowered yield which would otherwise result from dimensional inaccuracy of the color conversion member 170 or positioning inaccuracy thereof. The air layer 180 is formed between the color conversion member 170 and the lens 160 to reduce the likelihood of contact between the lens 160 and the color conversion member 170 transformed by an external force therein. The air layer enables the LED chip 10 and respective bonding wires 14, 14 to be free from a stress which is generated in the color conversion member 170 in response to an external force and then transferred through the lens 160 and the encapsulation member 150, leading to improving reliability. In addition, with the air layer 80 provided between the color conversion member 170 and the lens 160, transference of external moisture to the LED chip 10 can be suppressed.

Due to the presence of the air layer 180 between the color conversion member 170 and the lens 160, the lens 160 is allowed to pass therethrough only a small fraction of the light scattering from the yellowish fluorescent particles within the color conversion member 170 after being emitted from the LED chip 10 to be incident on the color conversion member 170 through the encapsulation member 150 and the lens 160, thereby giving an improved light extraction efficiency to the LED chip unit 1 as a whole.

Each of the LED chip units 1 is mounted to the inner bottom surface of the recess 192 of the main body 190 through the dielectric layer 80 made of a green sheet. As well as the other embodiments, the lighting apparatus with LEDs in the present embodiment enables to suppress the rise in temperature of the LED chip 10, possibly achieving the high light output as well as reducing the cost of the circuit board 20.

The windows 23 of the circuit board 20 shown in FIG. 25 are formed into circular shape for receiving the color conversion members 170 of the LED chip units 1. The circuit board 20 is provided with a plurality of through holes 27 for electrically connecting the outer leads 123b and the circuit pattern 22 by brazing material such as solder at each periphery of the windows 23 overlapping the respective outer lead 123b of the LED chip unit 1. Each of the through holes 27 is formed to cover an inner surface extending in the thickness direction of the circuit board 20 and its peripheries on both sides of the circuit board 20 for connecting the circuit pattern 22 on the circuit board 20. The circuit board 20 may be provided with the mirror 24 (see FIG. 9) on the surface opposing the light-transmissive member 200 described below, and a whitish resist layer as a light reflection film, as well as the second embodiment.

The above main body 190 includes a plurality of (two in the present embodiment) attaching screw holes 195 extending from the inner bottom surface of the recess 191 to the other surface of the main body 190 for passing a plurality of (two in the present embodiment) attaching screws 198, enabling to attach the main body 190 to the supporting material 180 such as ceiling structure by means of the attaching screws 198.

A light-transmissive member 200 is disposed over the surface of the circuit board 20 remote from the inner bottom surface of the dent 192 of the main body 190 for passing the visible light from each of the LED chip units 1.

Figure 12:
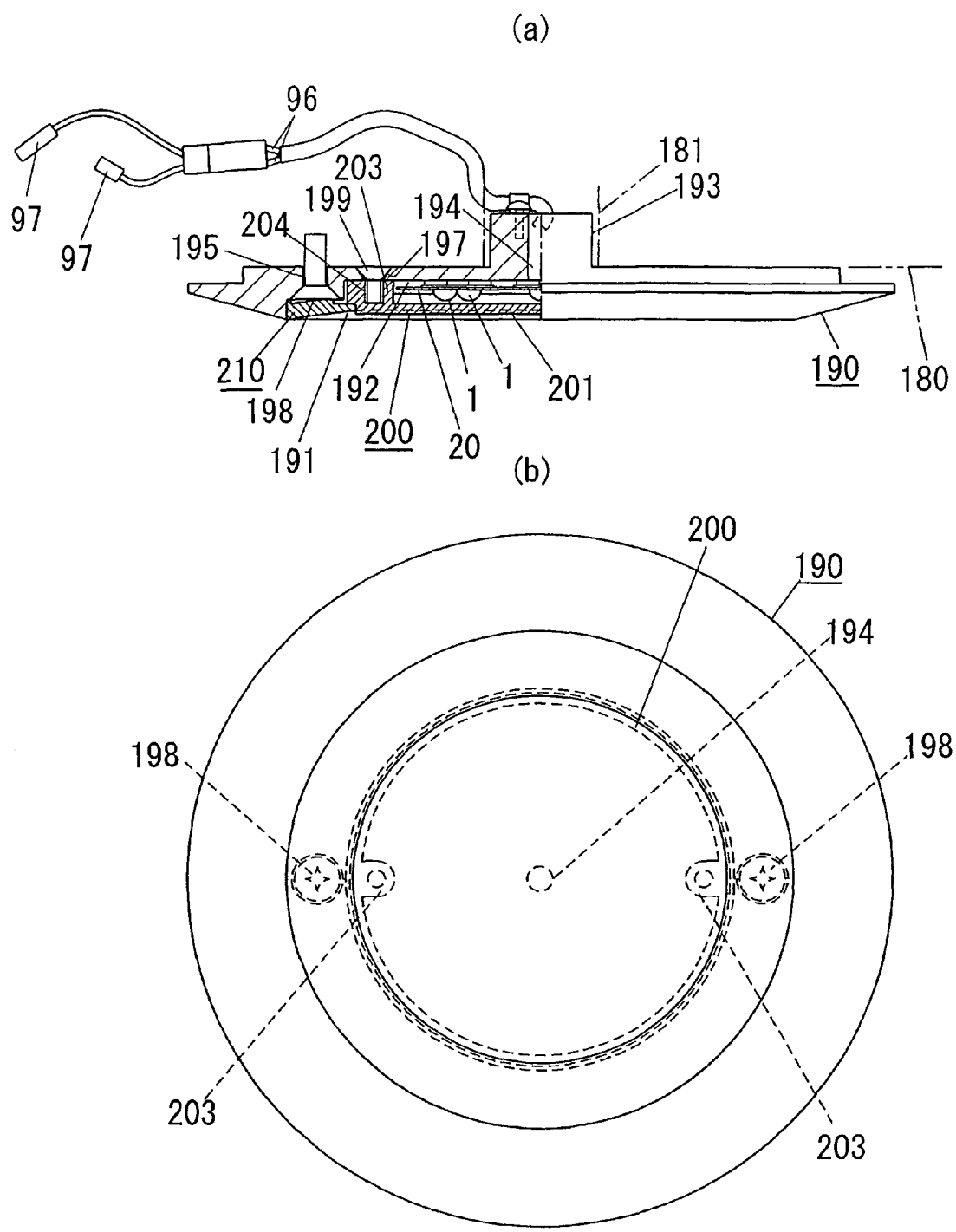
FIG. 12 includes a partly broken away schematic front view (a) and a schematic bottom view (b) in accordance with a fourth embodiment.
Figure 13:
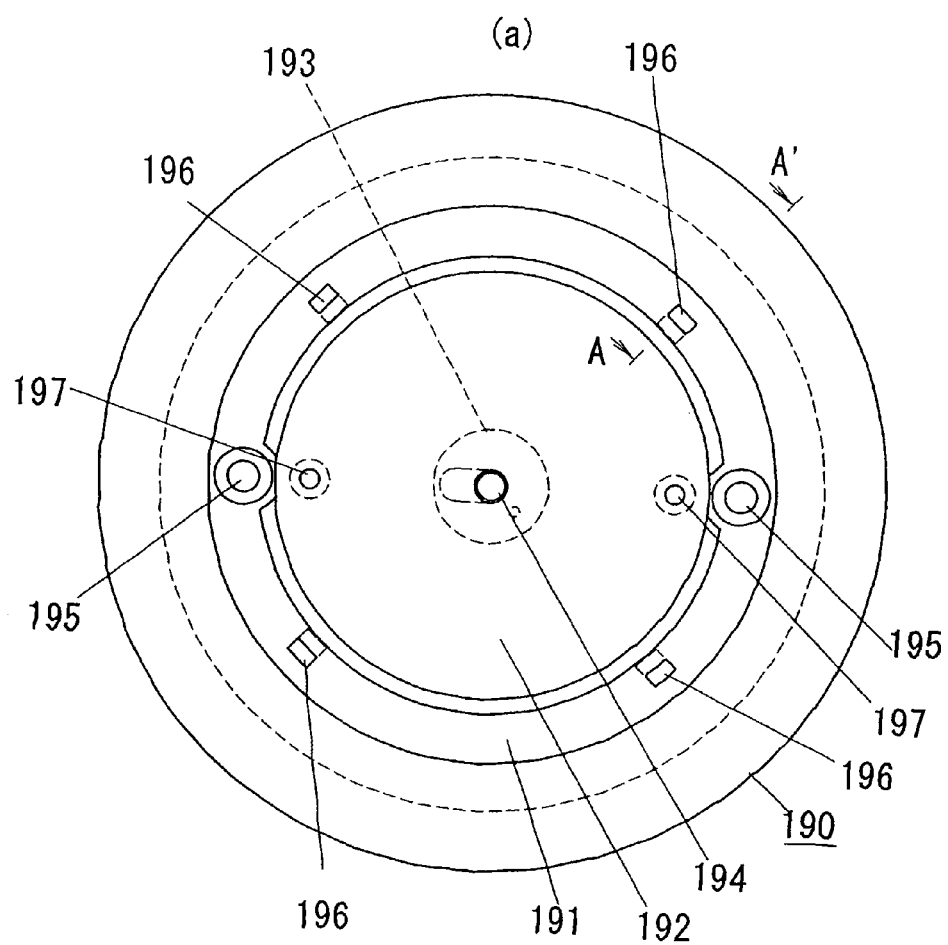
FIG. 13 shows a main body in the above embodiment, where (a) is a plan view and (b) is a cross sectional view taken along line A-A' of (a)
Figure 13:
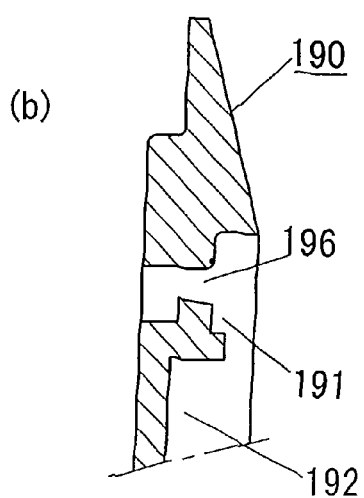
Figure 14:
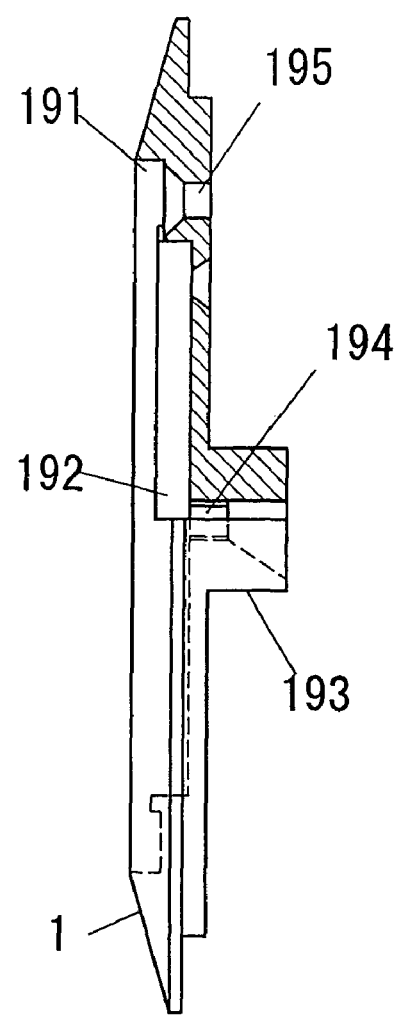
FIG. 14 shows the main body in the above embodiment, where (a) is a partly broken away cross sectional view and (b) is a plan view of an essential part.
Figure 14:
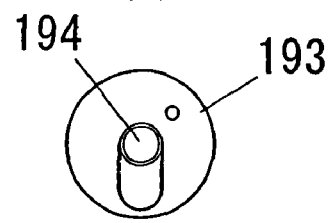
Figure 15:
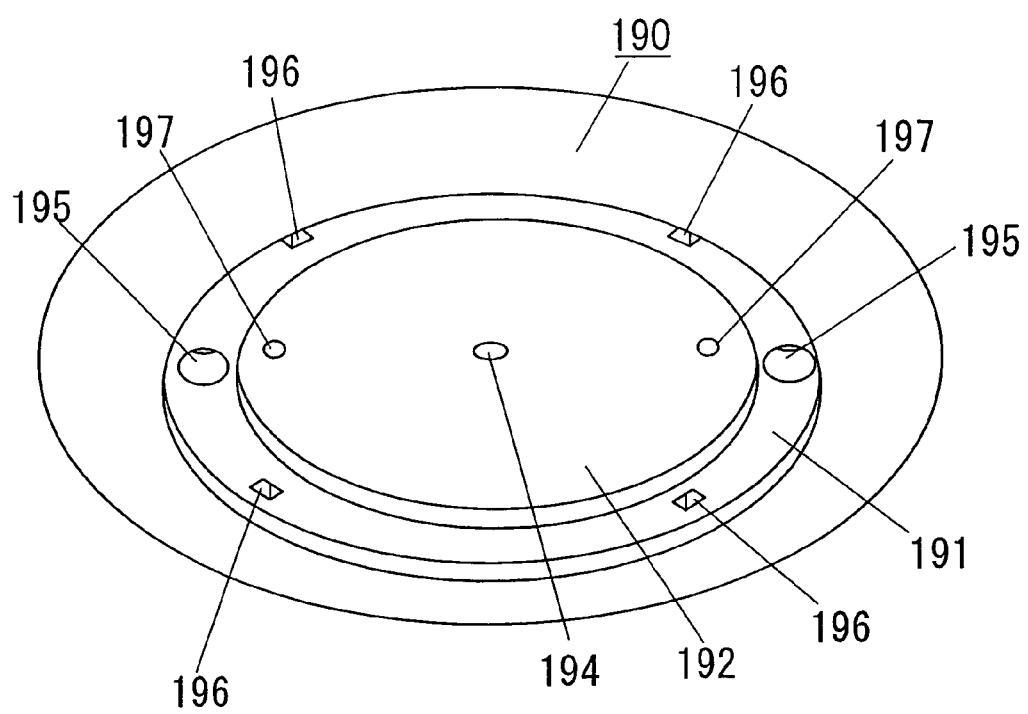
FIG. 15 is a perspective view of the main body in the above embodiment.
Figure 16:
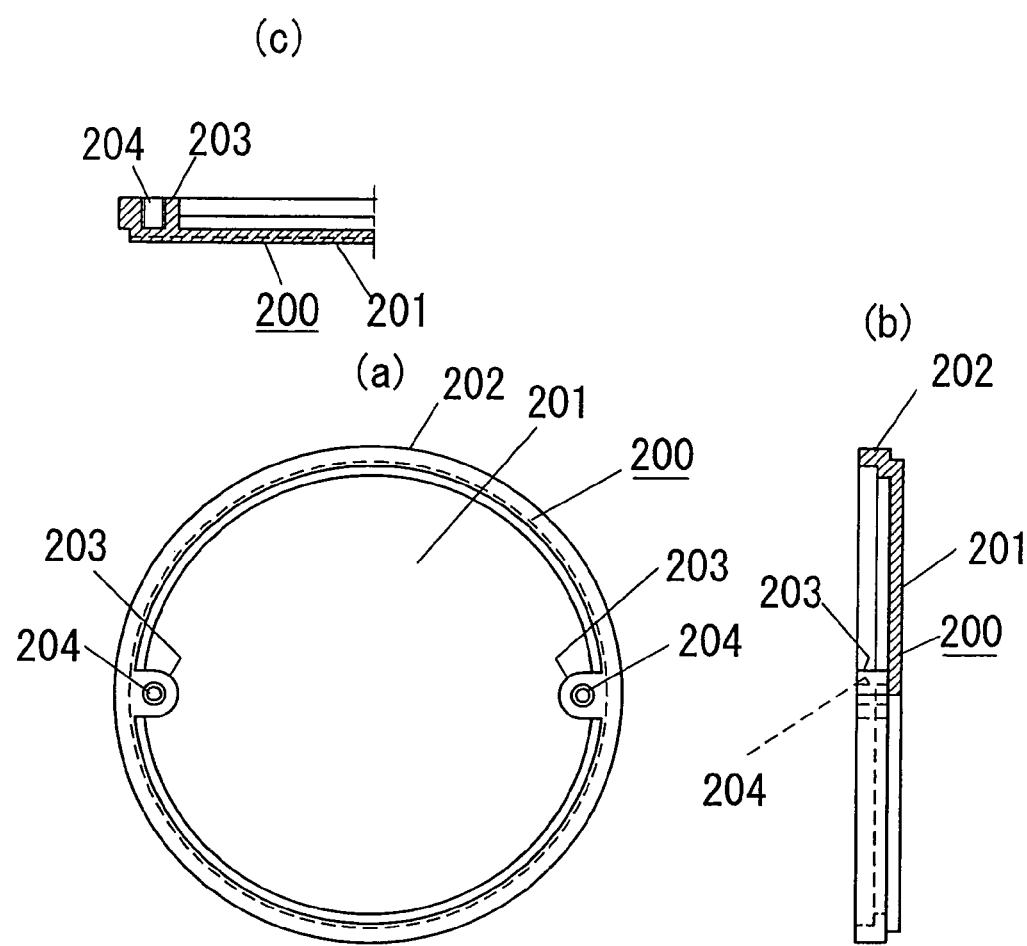
FIG. 16 shows a light-transmissive member in the above embodiment, where (a) is a plan view, (b) is a partially broken away cross sectional view, and (c) is a cross sectional view of an essential part.

The light-transmissive member 200 is formed of a molded article of light-transmissive material. (e.g. acryl resin etc.) The light-transmissive member 200 includes a front plate part 201 spaced away from the circuit board 20; and a ring-shaped side plate part 202 extending from the peripheral edge of the front plate part 201 towards the inner bottom surface side of the recess 191 of the main body 190, as shown in FIGS. 12 and 16. The main body 190 is formed with two fixing screw holes 197 for inserting fixing screws 199 therethrough to fix the light-transmissive member 200 to the main body 190. Two boss parts 203 are formed integrally to the light-transmissive member 200 and provided with fixing screw holes 204 for receiving front edges of fixing screws 199 which are inserted from the upper surface of the main body 190 through the fixing screw holes 197. The circuit board 20 is formed with cutouts 28 at the portions of its periphery corresponding to the boss parts 203.

The lighting apparatus with LEDs of the present embodiment includes a decorative cover 210 for covering a periphery of the dent 192 and each of the attaching screws 198 on the main body 190. The decorative cover 210 has a circular-shaped opening window 211 for exposing the light output surface (bottom surface in FIG. 12(a)) of the light-transmissive member 200. The main body 90 is attached to the ceiling material 180 by the attaching screws 198, and then the decorative cover 210 is fixed to the main body 90, enabling to improve its aesthetic appearance for the attaching screws 198 hidden behind the decorative cover 210. Herein, the decorative cover 210 is formed of an elastic synthetic resin (e.g., PBT, ABS etc.), and provided with a plurality of engagement projections 212, protruding from its surface opposing the main body 190, for respectively engaged to a plurality of engagement holes 196 formed in the main body 190. In other words, the decorative cover 210 can be attached to the main body 190 by respectively engaging engagement projections 212 to engagement holes 196 of the main body 190.

Although the decorative cover 210 is formed of a molded article of synthetic resin, the decorative cover 210 may be made of metal for enhancing the thermally conductive performance and suppressing the rise in junction temperature of the LED chip 10, compared to that made of synthetic resin. When the decorative cover 210 is made of the metal, it may be formed to be removably attachable to the main body 190 by means of plate springs, or to be fixed by means of screws.

Figure 17:
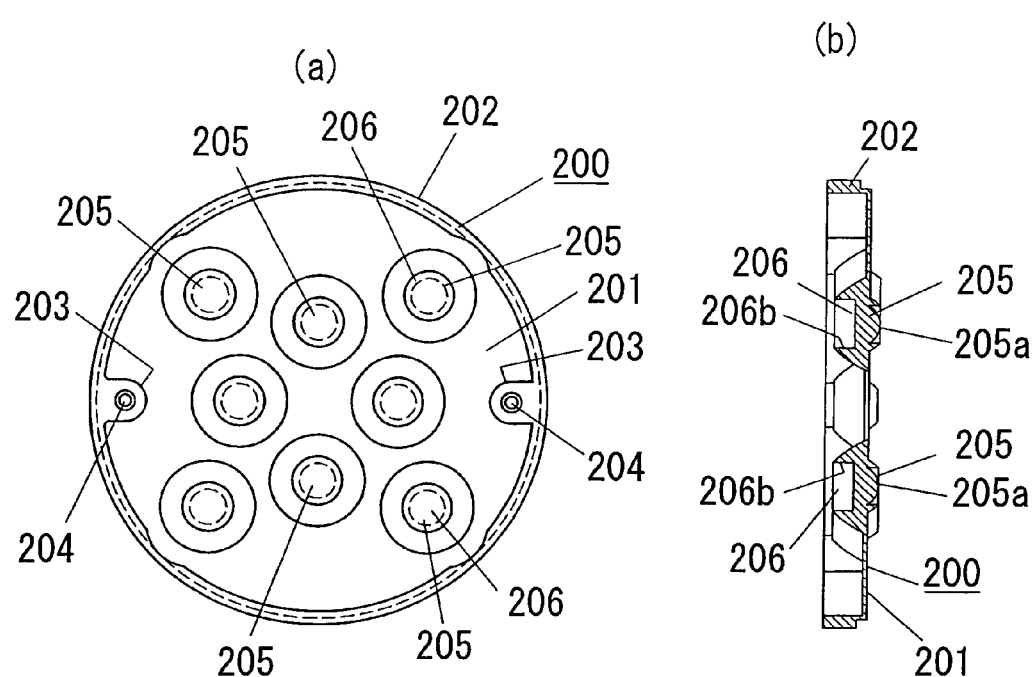
FIG. 17 shows another configuration example of the light-transmissive member in the above embodiment, where (a) is a plan view and (b) is a cross sectional view.
Figure 18:
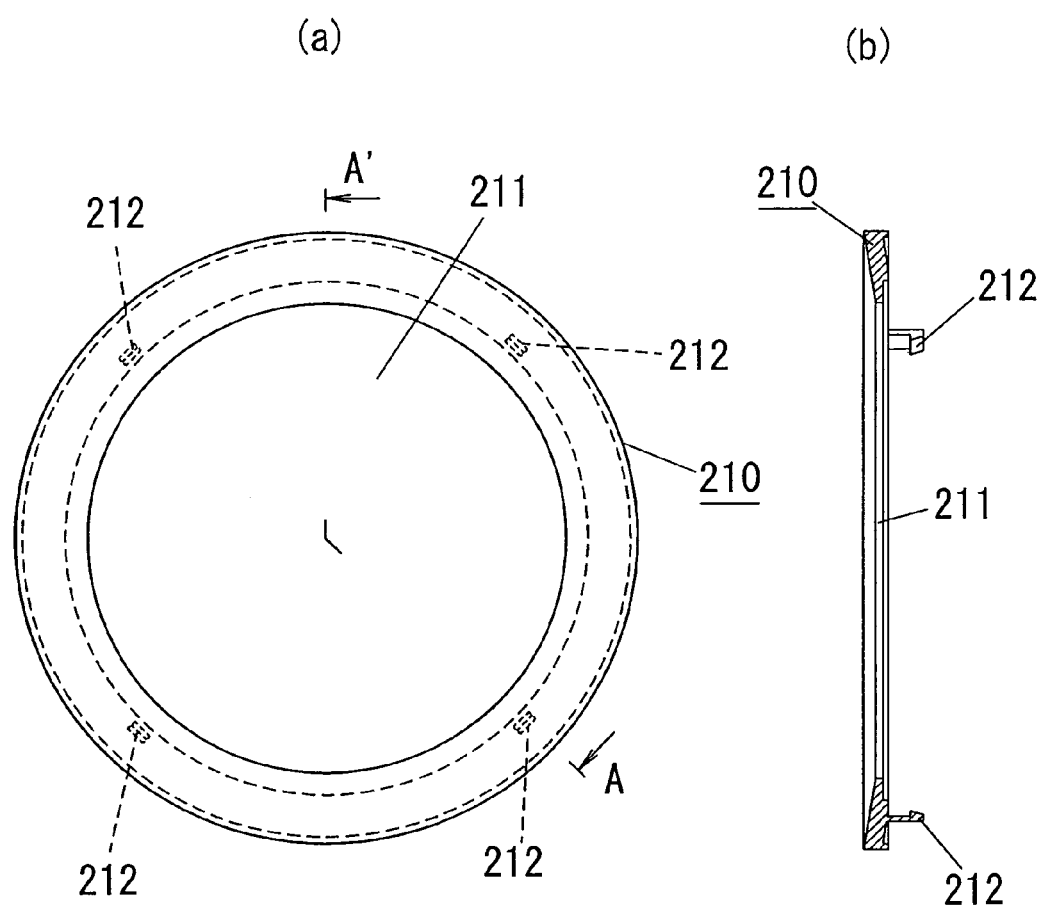
FIG. 18 shows a decorative cover in the above embodiment, where (a) is a plan view and (b) is a cross sectional view taken along line A-A' of (a)
Figure 19:
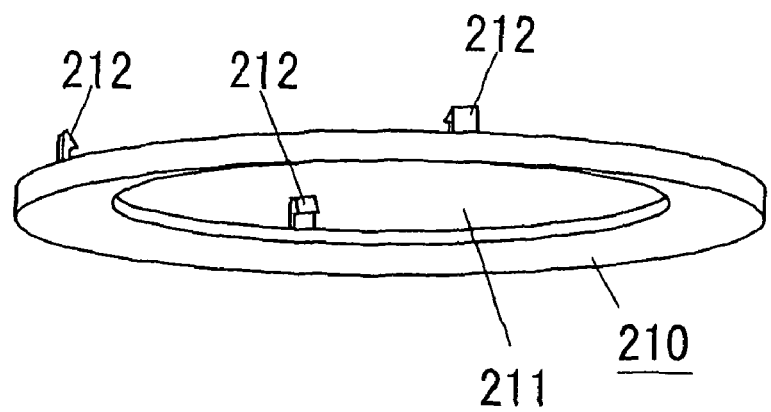
FIG. 19 is a perspective view of the decorative cover in the above embodiment.
Figure 20:
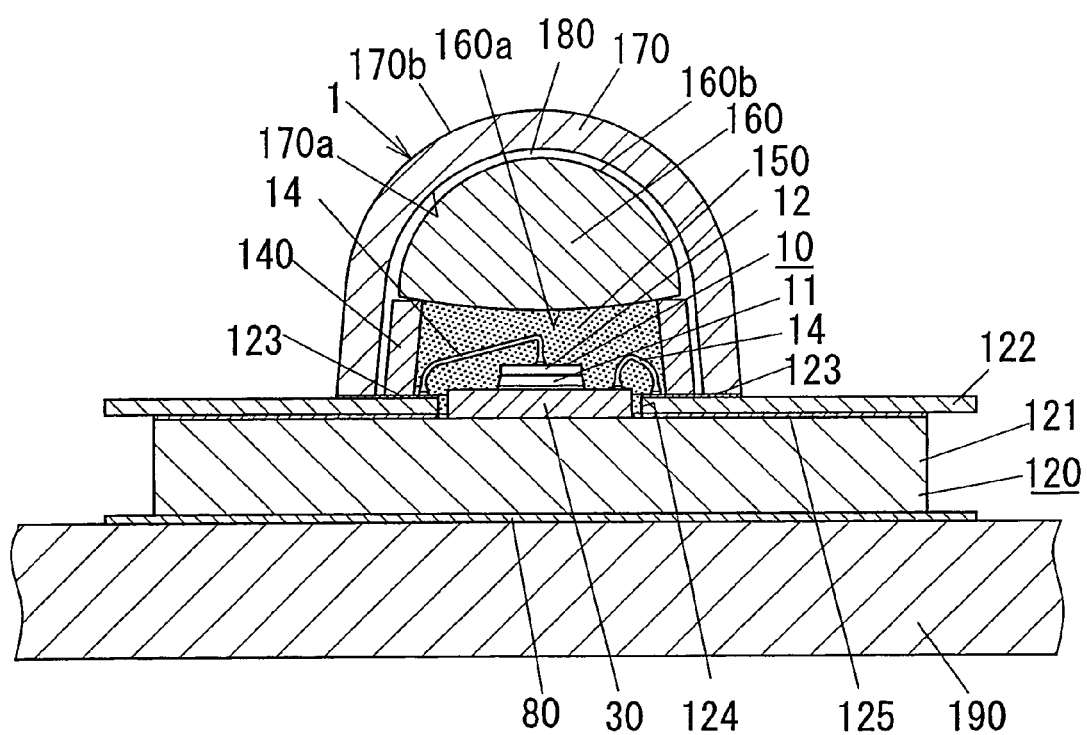
FIG. 20 is a schematic cross sectional view of the LED chip unit mounted to the main body in the above embodiment.
Figure 21:
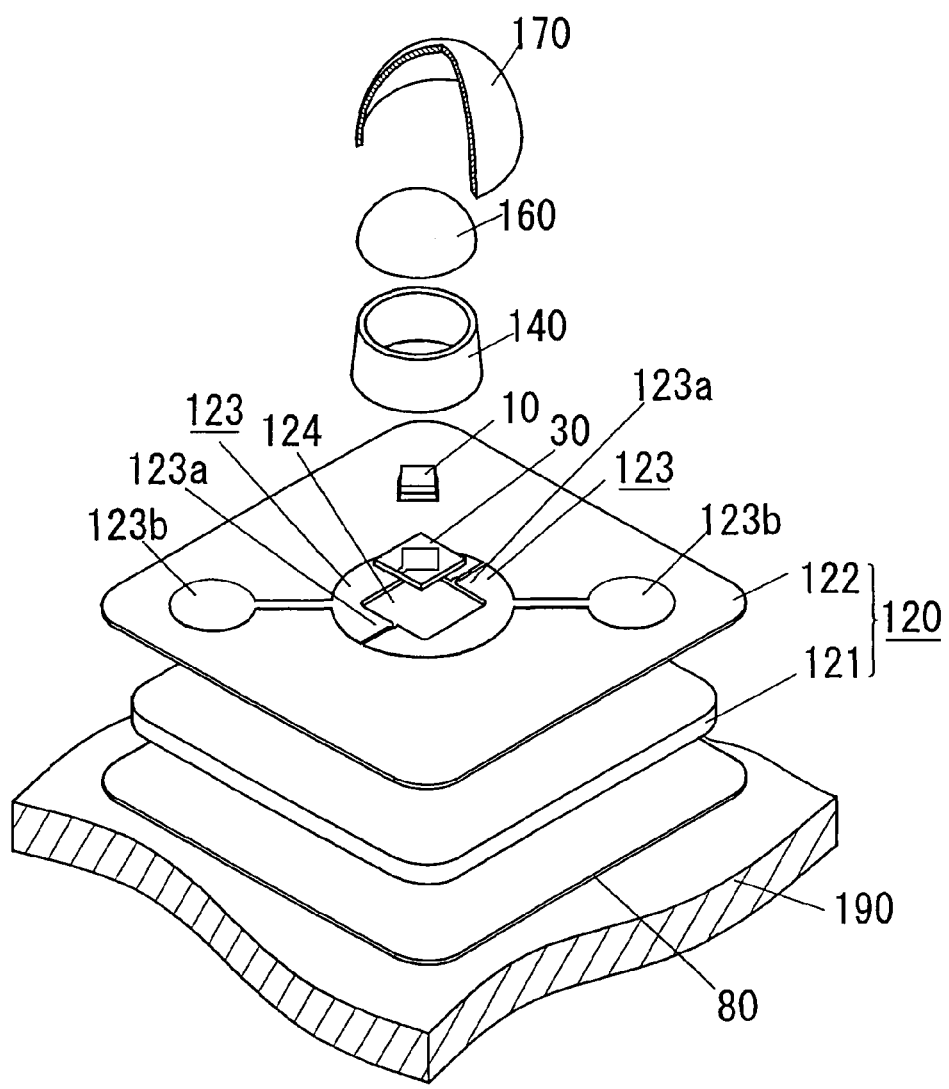
FIG. 21 an exploded perspective view of an essential part in the above embodiment.
Figure 22:
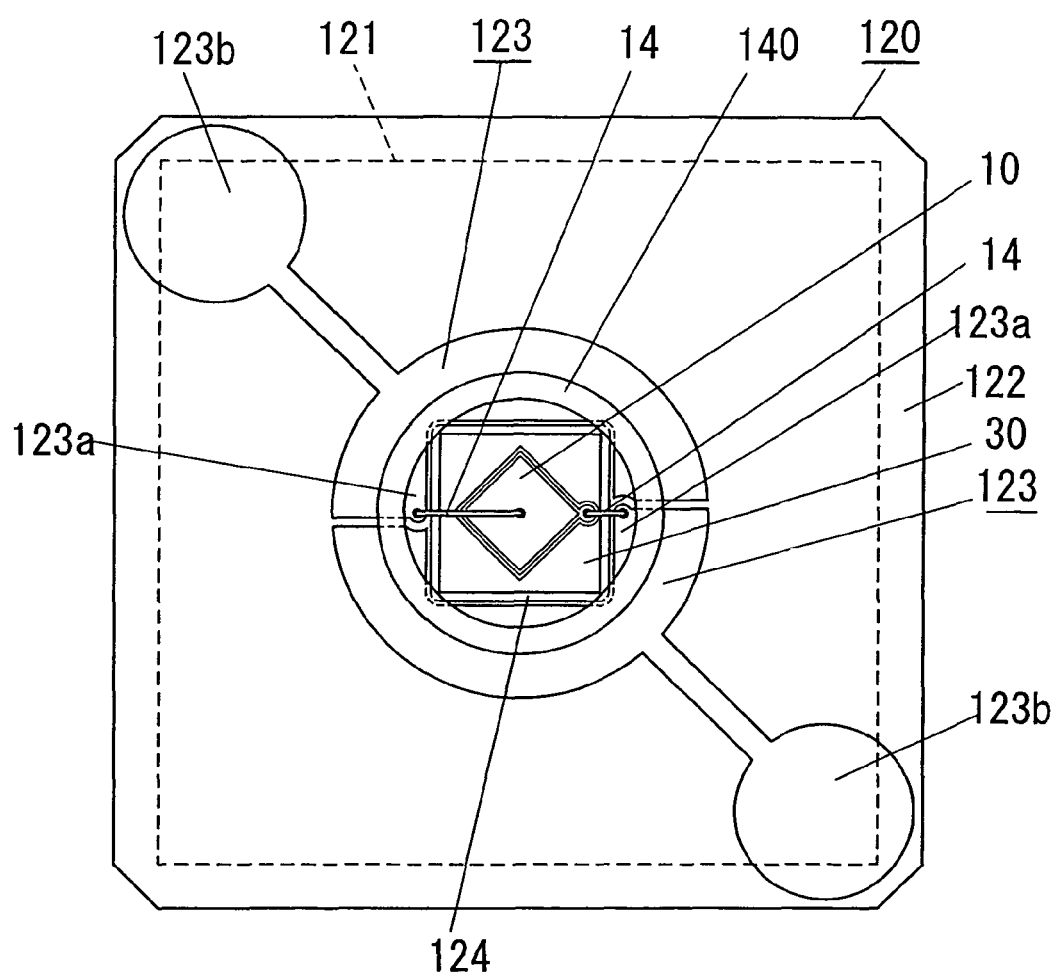
FIG. 22 is a plan view of an essential part of the LED chip unit in the above embodiment.
Figure 23:
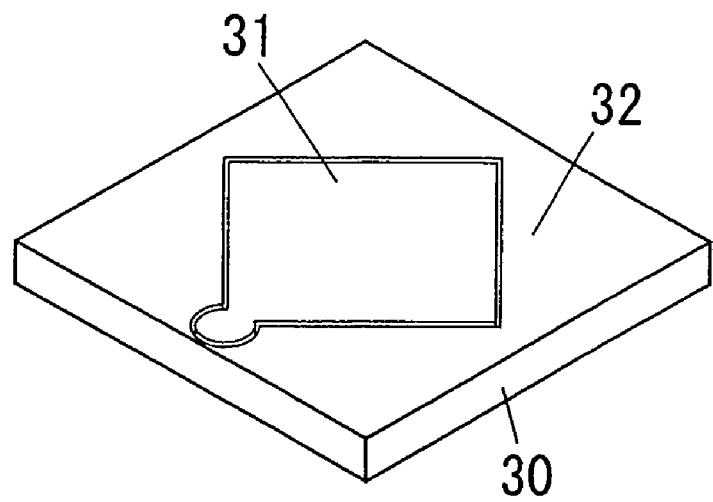
FIG. 23 is a perspective view of a sub-mount member in the above embodiment.
Figure 24:
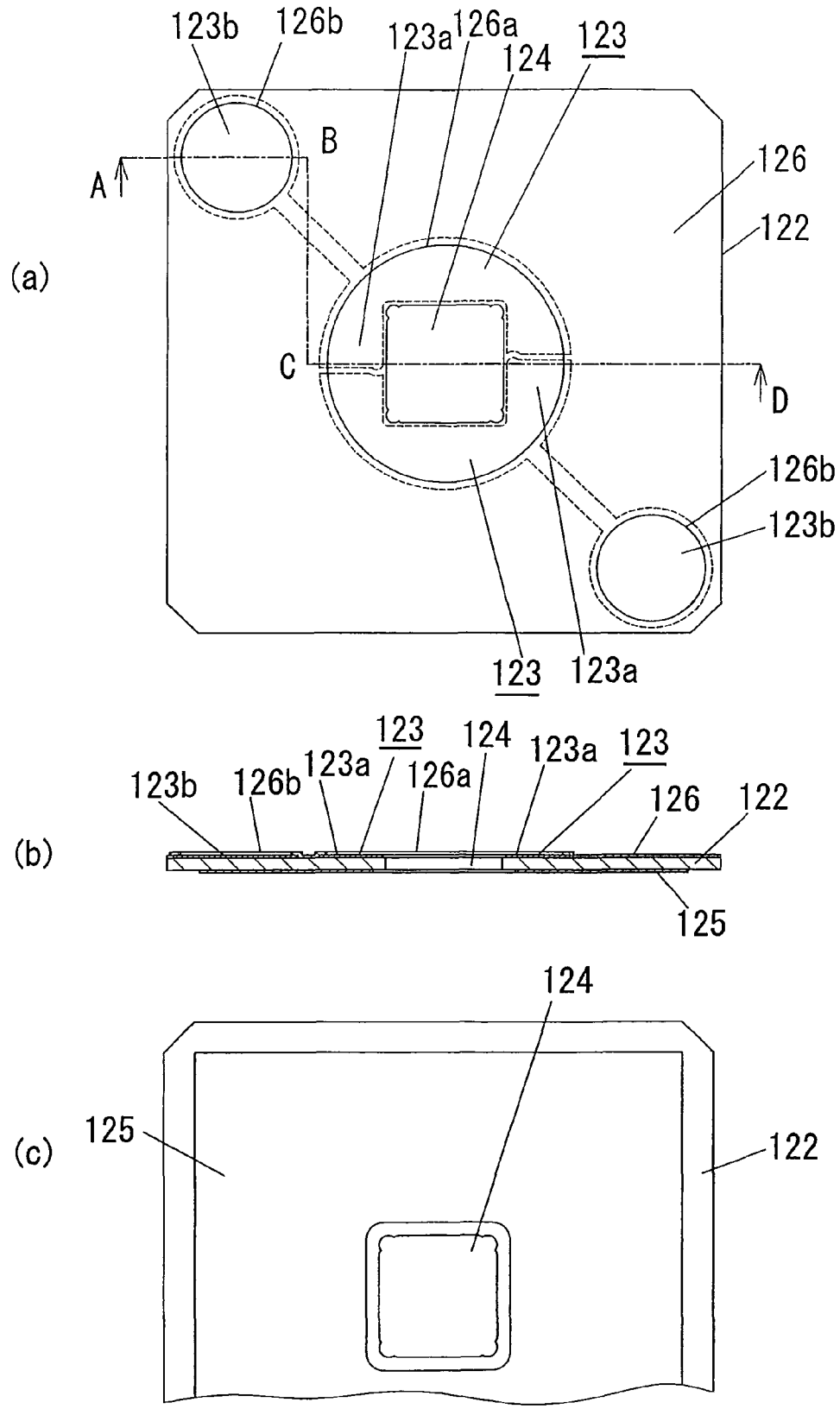
FIG. 24 shows a dielectric board in the above embodiment, where (a) is a plan view, (b) is a cross sectional view taken along line A-B-C-D of (a), and (c) is a partially broken away bottom view.

In the light-transmissive member 200, the front plate part 201 is formed into a flat plate, but may be a molded article of light-transmissive material (e.g. acryl resin, glass etc.) with lenses 205 which are respectively arranged at portions opposing the LED chip units 1 for controlling the light emitted from the LED chip unit 1 as shown in FIG. 17. Herein, each of the lenses 205 is flannel lens, and provided with a recess 206 for receiving the color conversion member 170 of the LED chip unit 1. Each of the lenses 205 is disposed to coincide its optical axis with that of the lens 160 of the LED chip unit 1. Each of the lenses 205 enables to orient the light radiated from an inner surface 206b of a recess 206 toward a light output surface 205a of the lens 205.

When the light-transmissive member is made of the metal except the each of the lenses 205, this configuration in FIG. 17 enables to enhance the thermally conductive performance and suppress the rise in junction temperature of the LED chip 10, compared to being entirely made of synthetic resin, glass, or the like.

Fifth Embodiment

Figure 26:
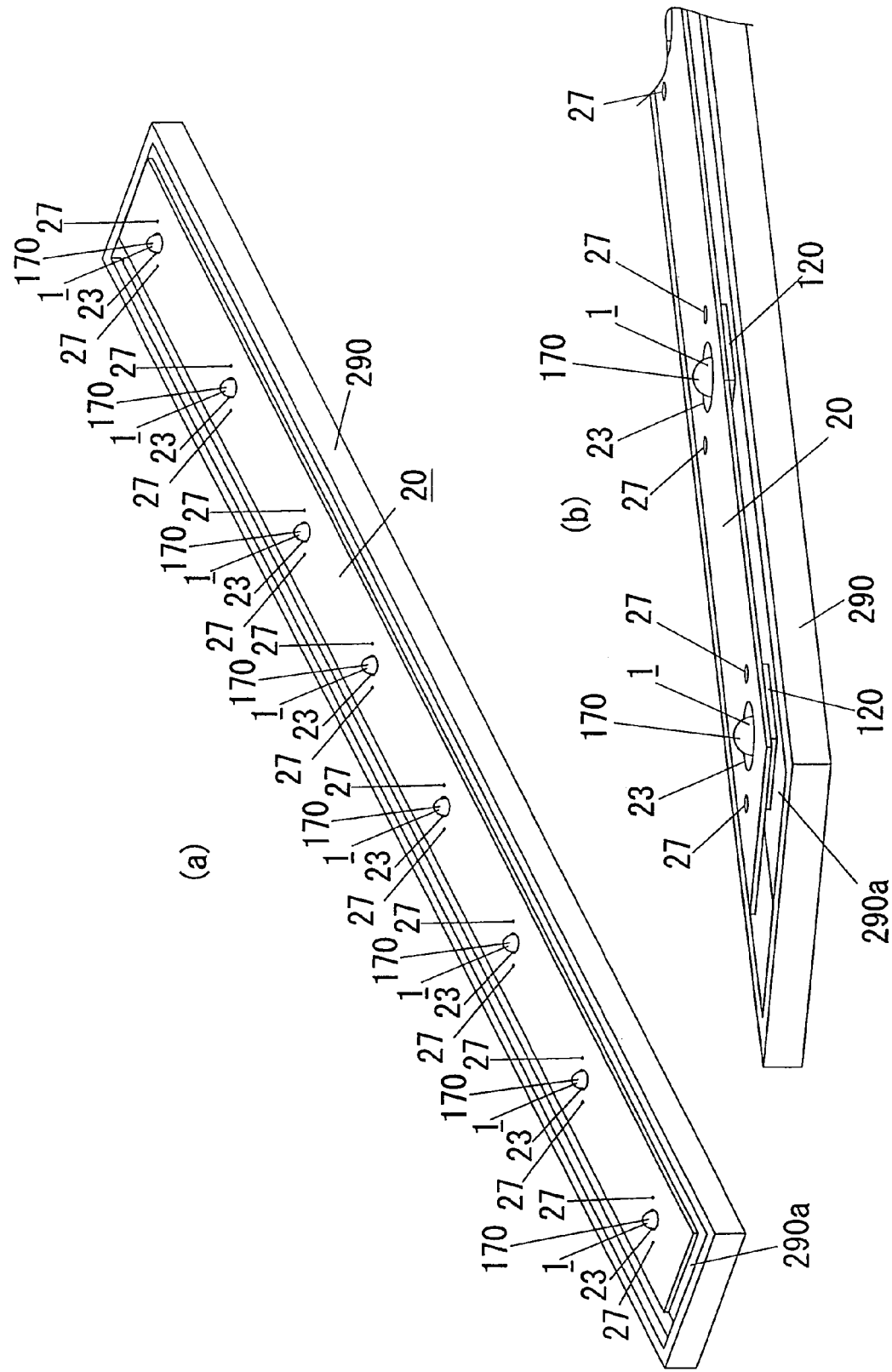
FIG. 26 shows a fifth embodiment, where (a) is a schematic perspective view, and (b) is an enlarged view of an essential part of (a)
Figure 27:
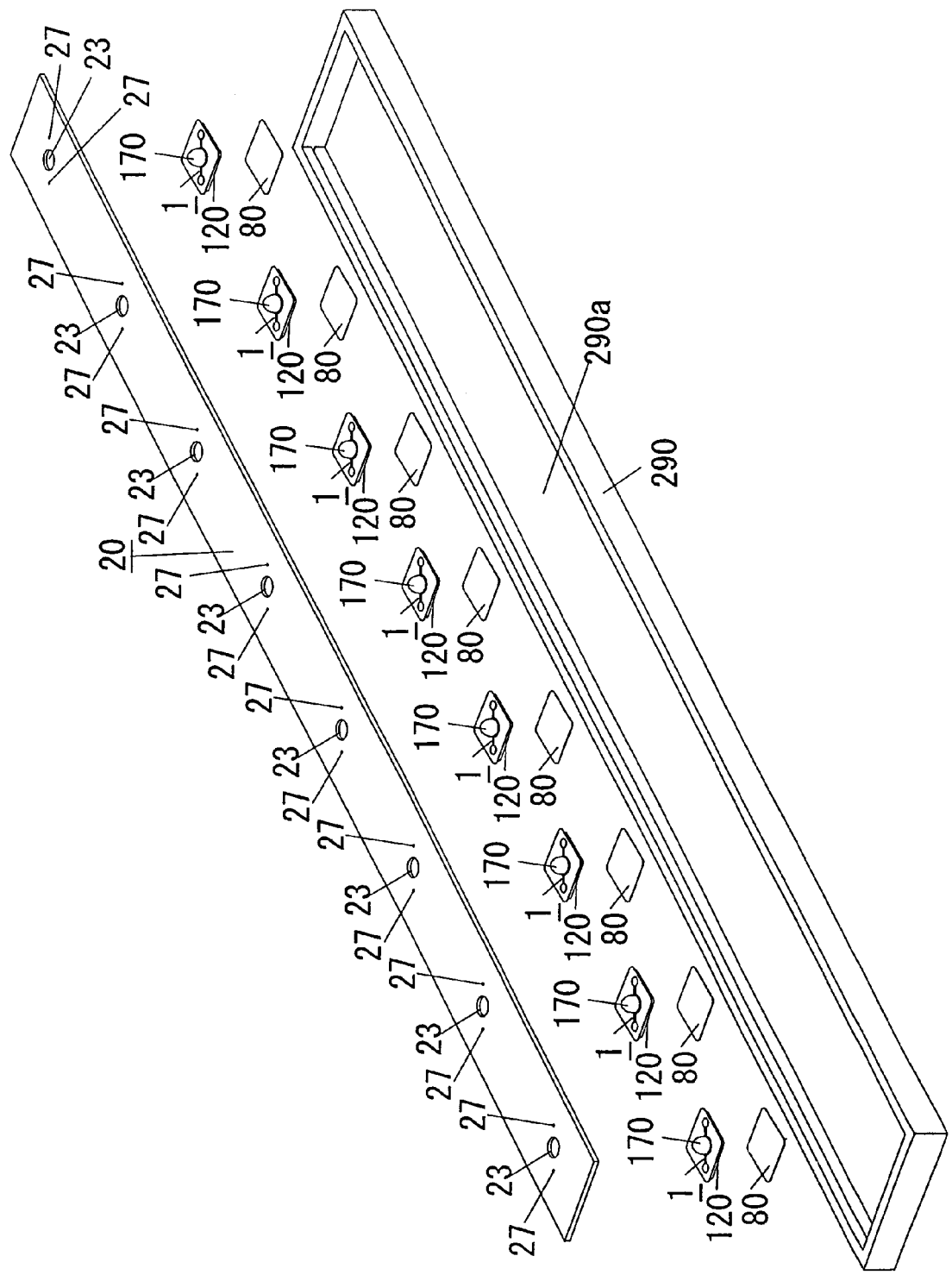
FIG. 27 is a schematic exploded perspective view in the above embodiment.

A lighting apparatus with LEDs of the present embodiment is different in the shape of a metal-made main body 290 from that of the fourth embodiment, as shown in FIGS. 26 and 27, and has the same configuration as the fourth embodiment in the LED chip unit 1. Like components as that of the fourth embodiment are designated by like reference numerals, and no duplicate explanation deemed necessary.

The main body 290 in this embodiment is formed into a band plate shape (elongated rectangular plate shape), and includes a plurality of (eight in the illustrated example) LED chip units 1, a recess 290a for accommodating a band plate-shaped circuit board 20. Herein, the plurality of LED chip units 1 is spaced by a predetermined interval in the longitudinal direction of the main body 290. As well as the fourth embodiment, each of the LED chip units 1 is mounted to an inner bottom face of the recess 290a of the main body 290 through the dielectric layer 80 (see FIG. 20) made of green sheet or the like.

A circuit pattern (not shown) is formed for connecting the LED chip unit 1 in series on the surface of the circuit board 20 opposing the inner bottom surface of the recess 290a to appropriately connect wires (not shown) extending to the recess 290a through insertion hole (not shown). It is noted that the circuit board 20 is provided with a window 23 and two through holes 27 at its portion corresponding to each of the LED units 1, as well as the fourth embodiment.

The lighting apparatus using LEDs of the present embodiment also enables to suppress the temperature rise in LED chip 10 for realizing high light output, and reduce the cost of the circuit board 20, as well as the fourth embodiment. The circuit board 20 in the present embodiment is not limited to glass epoxy board, and may be one such as a flexible print wiring board (FPC).

Sixth Embodiment

Figure 28:
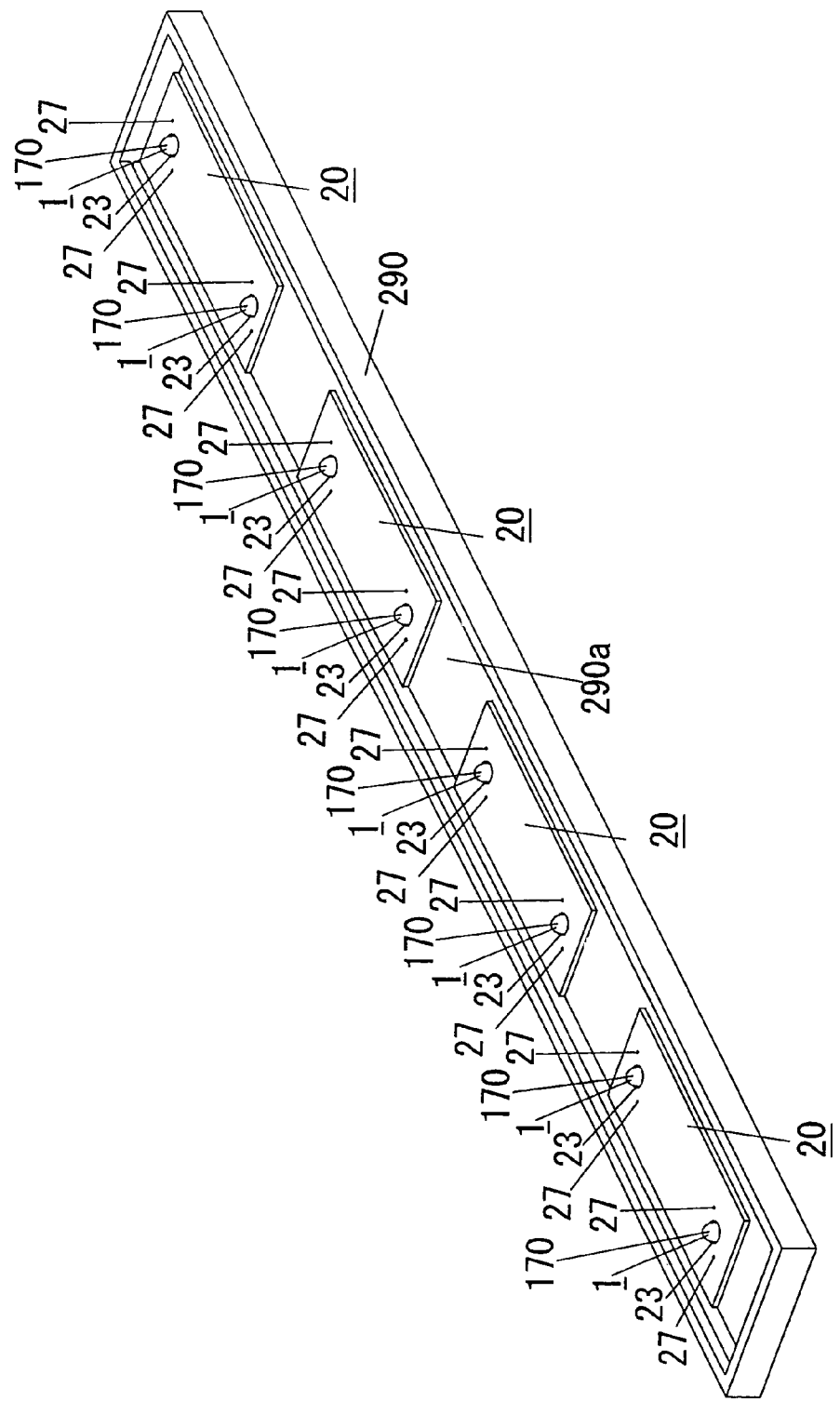
FIG. 28 is a schematic perspective view in a sixth embodiment.
Figure 29:
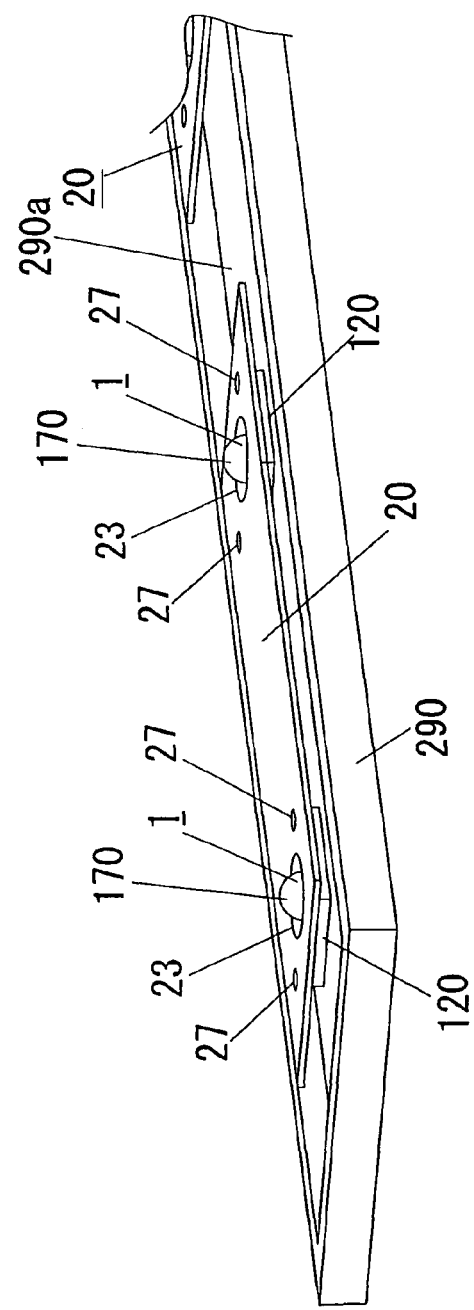
FIG. 29 is an enlarged perspective view of an essential part in the above embodiment.
Figure 30:
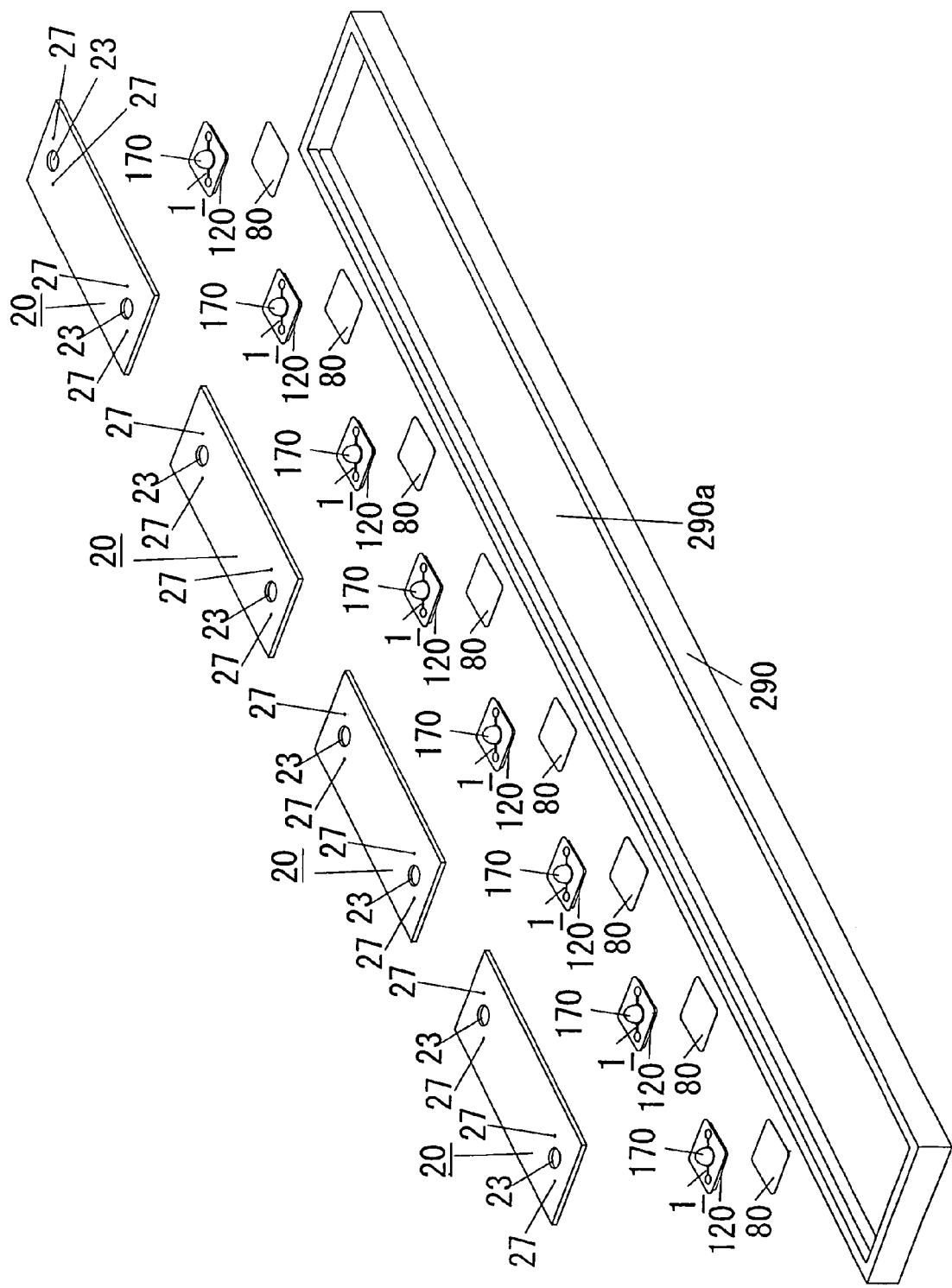
FIG. 30 is a schematic exploded perspective view in the above embodiment.

A lighting apparatus with LEDs of the present embodiment has almost the same basic configuration as the fifth embodiment in the LED chip unit 1. In the fifth embodiment, all the LED chip units are connected by means of one circuit board 20 within the main body 290, while all the LED chip units are connected by a plurality of the circuit boards 20 in this embodiment, as shown in FIGS. 28 to 30. In this embodiment, it is noted that two LED chip units 1 are arranged in the longitudinal direction of the main body 290 for each of the circuit board in series, where neighboring LED chip units are electrically connected by means of lead wires (not shown). Other configuration of the present embodiment is the same as that of the fourth embodiment, and no duplicate explanation deemed necessary.

In other embodiments, one circuit board 20 may be replaced with a plurality of circuit boards to appropriately connect the LED chip units.

Although a glass epoxy board is illustrated as the circuit board 20 in each of the above embodiments, the circuit board 20 may be one such as a ceramic MID board formed at its non-overlapping portions with the LED chip units with projections which come into contact with the main body, for further enhancing the thermally conductive performance.

The invention claimed is:
1. A lighting apparatus with LEDs comprising:
  a metal-made main body;
  a plurality of LED chip units each including an LED chip and a pair of lead terminals electrically connected to electrodes of said LED chip;
  a circuit board formed with a circuit pattern configured to supply an electric power to the individual LED chip units; and a dielectric layer disposed between said main body and said LED chip units for making electrical insulation therebetween as well as thermally coupling the same, wherein said circuit board is formed with a plurality of windows through which the individual LED chip units extend respectively with said lead terminals held in electrical contact with said circuit pattern at the periphery of said windows, each of said LED chip units being thermally coupled at its bottom face with said main body through said dielectric layer, a light-transmissive member being provided to pass a visible light from each of said LED chip units, said light-transmissive member comprising lenses at respective portions opposed to said LED chip units for determining orientation of the light given off from said LED chip units, said light-transmissive member being made of metal at a portion other than said lenses, said portion other than said lenses contacting with said main body wherein a mirror is formed on a top face of said circuit board opposed to said light-transmissive member for reflecting the visible light.

2. A lighting apparatus with LEDs as set forth in claim 1, wherein said circuit board is formed on its top face opposed to said light-transmissive member with said circuit pattern and said mirror.

3. A lighting apparatus with LEDs as set forth in claim 2, wherein said mirror is made of aluminum.

4. A lighting apparatus with LEDs as set forth in claim 1, wherein said circuit board is formed on its bottom face with said circuit pattern.

5. A lighting apparatus with LEDs as set forth in claim 4, wherein said mirror is made of aluminum.

6. A lighting apparatus with LEDs as set forth in claim 1, wherein said mirror is made of aluminum.

7. A lighting apparatus with LEDs as set forth in claim 1, wherein said main body is formed at portions around the recess with attaching screw holes respectively for a plurality of attaching screws adapted to fix the main body to a supporting material, a decorative cover in the form of a frame is assembled to said main body to conceal the periphery of said recess and said attaching screws on one face of said main body, said decorative cover having a window for exposing therethrough a light output surface of said light-transmissive member, and being made of a metal.

8. A lighting apparatus with LEDs as set forth in claim 1, wherein each of said LED chip units having its bottom face defined by said lead terminals which are directly superimposed on said dielectric layer.

9. A lighting apparatus with LEDs as set forth in claim 1, wherein each of said LED chip units comprises:

a thermally conductive plate made of a thermally conductive material and mounting thereto said LED chip;

a sub-mount member interposed between the LED chip and said thermally conductive plate to relieve a stress acting on said LED chip due to a difference of coefficient of linear expansion therebetween; and a dielectric board formed with a pair of terminal patterns for electrical connection respectively with the electrodes of said LED chip, said terminal patterns defining said lead terminals, said dielectric board being formed with a hole receiving said sub-mount member which is held in direct contact with said thermally conductive plate, said LED chip unit having its bottom face defined by said thermally conductive plate.

10. A lighting apparatus with LEDs as set forth in claim 9, wherein said terminal pattern has its one portion exposed on the surface of said dielectric board to define an outer lead which is electrically connected to the circuit pattern of said circuit board at a circumference of said window.

11. A lighting apparatus with LEDs as set forth in claim 1, wherein said lighting apparatus with LEDs is adapted in use to be attached to a supporting material, said metal-made main body including an inner part having its upper surface contacting with the supporting material, and a flange part configured to surround said inner part, and said flange part being configured to lower its upper surface relative to the upper surface of said inner part.

12. A lighting apparatus with LEDs as set forth in claim 1, wherein said main body is shaped into a disk formed in its one face with a recess for receiving therein said LED chip units and said circuit board, a wire insertion hole being provided in the center of said main body to extend through the bottom of said recess for passing a power feeding cable, and said circuit board being provided with a power feeding through-hole at its center exposed via said wire insertion hole, and said power feeding through-hole being electrically connected to said circuit pattern and being adapted I use to be connected to said power feeding cable which is inserted into said recess via said wire insertion hole.

* * * * *